US006713523B2

(12) United States Patent
Nagata et al.

(10) Patent No.: US 6,713,523 B2
(45) Date of Patent: Mar. 30, 2004

(54) PHOTOPOLYMERIZABLE COMPOSITION AND PHOTOSENSITIVE THERMAL RECORDING MATERIAL

(75) Inventors: Kozo Nagata, Shizuoka-ken (JP); Shintaro Washizu, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 173 days.

(21) Appl. No.: 09/985,386

(22) Filed: Nov. 2, 2001

(65) Prior Publication Data

US 2002/0168494 A1 Nov. 14, 2002

(30) Foreign Application Priority Data

Nov. 2, 2000 (JP) ........................................ 2000-336485

(51) Int. Cl.$^7$ ............................. C08F 2/46; G03C 1/675; G03C 1/73; G03C 1/735
(52) U.S. Cl. ............................. 522/25; 522/29; 522/26; 522/182; 522/183; 430/281.1
(58) Field of Search ............................... 522/25, 26, 29, 522/182, 183, 63; 430/281.1, 270.1

(56) References Cited

U.S. PATENT DOCUMENTS

| 5,049,481 | A | * | 9/1991 | Okamoto et al. | ........ 430/283.1 |
| 5,496,903 | A | * | 3/1996 | Watanabe et al. | ........... 526/204 |
| 5,945,249 | A | * | 8/1999 | Patel et al. | ................. 430/200 |

* cited by examiner

*Primary Examiner*—Susan Berman
(74) *Attorney, Agent, or Firm*—Sughrue Mion, PLLC

(57) ABSTRACT

The invention discloses a photopolymerizable composition comprising at least one, ethylenic unsaturated bond-containing compound, a hexaaryl-biimidazole compound, and an organoboron compound represented by a specific general formula; and discloses a photosensitive thermal recording material having a recording layer that contains the photopolymerizable composition. The photopolymerizable composition and the photosensitive thermal recording material of the invention are highly sensitive to UV rays and visible to IR rays falling within a wavelength range that includes wavelengths not longer than 450 nm, and are effective for decoloring a dye component that absorbs the rays falling within the wavelength range.

18 Claims, No Drawings

PHOTOPOLYMERIZABLE COMPOSITION AND PHOTOSENSITIVE THERMAL RECORDING MATERIAL

BACKGROUND OF THE INVENTION

1. Field of the Invention

The present invention relates to a photopolymerizable composition and a photosensitive thermal recording material which are sensitive to a broad wavelength range including UV rays and visible to IR rays thus enabling high-sensitivity recording and which are favorable for use in various fields including those of ink, color filters, holograms, proofs, sealants, adhesives, lithography, resin relieves, photoresists and the like. More precisely, the invention relates to such a photopolymerizable composition and a photosensitive thermal recording material which are particularly sensitive to rays whose wavelength are not longer than 450 nm to enable high-sensitivity recording.

2. Description of the Related Art

Various dry-type image-recording methods in which liquid developers are not used and waste is not generated have heretofore been investigated. Much attention is being paid to a method in which a photocurable composition is used. The method is characterized in that a photocurable composition in a recording material is cured through exposure to light to form a latent image on the material, and a component of the non-exposed area which has the effect forming or erasing color when heat is applied, is caused to migrate to thereby form a color image. More specifically, a recording material is exposed to light through an original image so that the exposed area of the material is cured to forma latent image thereon, and thereafter the material is heated so that a component of the non-cured area (non-exposed area) which is used in the color formation or color erasing reaction is caused to migrate in the material to thereby form a visible image.

The method realizes a complete dry-type image-recording system in which waste is not generated. This is usable in black-and-white image recording, but is especially favorable for color image recording.

Some recording materials employable in the method have been proposed. For example, known is a two-component type, photosensitive thermal color image-recording material described in JP-A No. 52-89915. This contains two components which are an electron-receiving compound and an electron-donating leuco-dye, and contains a photocurable composition inside and/or outside the microcapsules therein. In this method, however, even though the photocurable composition in the microcapsules is fully cured, it is still impossible to sufficiently control color formation in the cured area of the material. Therefore, the material is defective in that the non-image area thereof is colored and the image contrast is low.

JP-A 61-123838 discloses a recording material free from the problem of coloration in the non-image area. This comprises a layer of a photopolymerizable composition that contains an acidic group-having vinyl monomer and a photopolymerization initiator, a spacer layer, and a layer that contains an electron-donating leuco-dye. Color formation does not occur in the non-image area, that is, the area cured through photopolymerization, but there is the disadvantage that its color density is somewhat low.

Given that situation, the present applicant has previously proposed recording materials that enable high image density with no coloration in the non-image area, as in JP-A Nos. 3-87827 and 4-211252. The former is a two-component type, photosensitive thermal color-image forming material, in which one of the two components is encapsulated in microcapsules, and the other is a curable compound in a photocurable composition or the other is outside the microcapsules along with a photocurable composition. The latter is a photosensitive thermal recording material which comprises a layer that contains an electron-donating leuco-dye in the microcapsules and outside the microcapsule contains a photocurable composition that comprises an electron-receiving compound, a polymerizing vinyl monomer and a photopolymerization initiator.

For recording color images on photosensitive thermal recording materials of those types, used are multi-color forming recording materials each having, on a support, plural recording layers, the respective layers being sensitive to particular wavelength ranges of light thus forming different colors.

One example of such multi-color forming recording materials is the above-mentioned photosensitive thermal recording material which the present applicant has proposed. Specifically, it comprises plural recording layers sensitive to the respective wavelength ranges of light and forms different colors, and more specifically, it comprises a first recording layer sensitive to light having a center wavelength of $\lambda_1$ and forms a color, an interlayer that absorbs the light having a center wavelength of $\lambda_1$, a second recording layer sensitive to light having a center wavelength of $\lambda_2$ and forms a color that differs from the color formed by the first recording layer, . . . an interlayer that absorbs light having a center wavelength of $\lambda_{(i-1)}$ an i'th recording layer sensitive to light having a center wavelength of $\lambda_1$ and forms a color that differs from the colors formed by the first, second, . . . (i−1)th recording layers, laminated in that order on a support with i≧2, wherein the first layer is the furthest from the support and is the nearest to the light source to which is it exposed. The center wavelength, $\lambda$, of the light to which it is exposed is in the order of $\lambda_1 < \lambda_2 < \ldots < \lambda_i$.

However, small-sized inexpensive IR lasers and blue to red light emitters are useless as a light source for recording images on such recording materials. If small-sized inexpensive IR lasers or blue to red light emitters are used for recording fine images thereon at high speed, the recording layer must contain a dye capable of absorbing visible rays that fall within the wavelength range of the light source. However, when such a dye, especially that capable of absorbing light that falls within a visible-ray range is introduced into the recording layer, the background of the recording material is colored, thereby lowering the contrast and the quality of the images formed. For increasing the image contrast, the dye in the recording layer will have to be decolored. This, however, requires an extremely long exposure time, and interferes with high-speed image output.

On the other hand, if a dye capable of absorbing near-IR light is used in such recording materials, the background coloration can be prevented. However, this has another drawback in that the lasers usable for the recording materials are expensive.

A high-power violet laser having a laser wavelength of around 405 nm has been developed recently as the light source that emits blue to red rays having wavelengths not exceeding 450 nm, but its power is at most 5 mW or so. Therefore, if the laser falling within the wavelength range is to be used, the sensitivity of the recording materials in that wavelength range must be increased. However, in order to increase the sensitivity, it is necessary to introduce a dye component into the recording layer of the materials for the same reasons described hereinabove. If a dye component capable of absorbing light that falls within the wavelength range is introduced thereinto, the recording materials are yellowed; and if the dye component therein is not completely decolored, the background area of the images formed (that is, the non-image area) in the materials is yellowish, and the images are fogged and their commercial value decrease. Introducing such a dye component into the recording layer is therefore problematic with respect to these points.

As mentioned above, no one has as yet succeeded in providing a photopolymerizable composition for a photosensitive thermal recording material which is highly sensitive to rays having a wavelength of less than 450 nm and which is capable of forming thereon detailed and high-contrast images of high quality with no yellowish fog in the background area around the images even when exposed with a relatively low-power light source.

SUMMARY OF THE INVENTION

The present invention is to solve the problems in the prior art noted above and to attain the objects mentioned below.

Specifically, one object of the invention is to provide a photopolymerizable composition which is highly sensitive to UV rays and visible to IR rays within a wavelength range that includes wavelengths not longer than 450 nm, which is well effective for decoloring a dye component that absorbs the rays falling within the above-mentioned wavelength range, and which therefore does not yellow after exposure to light.

Another object of the invention is to provide a photosensitive thermal recording material which is processable in a complete dry system and thus does not require liquid developer and does not generate waste. This would enable high-sensitivity image recording thereon by exposure with light falling within a range of UV rays and visible to IR rays, and especially exposure with rays having wavelengths not exceeding 450 nm, and which almost completely decolors the non-image area (background area) therein and therefore formation of high-contrast, black-and-white or color images with little fogging in the surrounding background area.

The means of the invention for solving the problems noted above are as follows.

The invention is a photopolymerizable composition comprising at least one, ethylenic unsaturated bond-containing compound, a hexaaryl-biimidazole compound, and an organoboron compound of the following general formula (1):

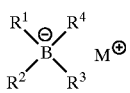
(1)

wherein $R^1$, $R^2$, $R^3$ and $R^4$ each independently represent an aliphatic group, an aromatic group, a heterocyclic group, or a group of the following general formula (2); and $M^+$ represents a group capable of forming a cation;

(2)

wherein $R^5$, $R^6$ and $R^7$ each independently represent an aliphatic group or an aromatic group.

One embodiment of the invention is the photopolymerizable composition that contains at least one of cationic organic dyes, anionic organic dyes and nonionic organic dyes.

Another embodiment of the invention is a photosensitive thermal recording material having recording layers on a support, in which at least one recording layer contains: a color-forming component A which is encapsulated in thermo-responsive microcapsules; a substantially colorless compound B which has a site which reacts with the color-forming component A to form a color and which exists outside the thermo-responsive microcapsules; and the photopolymerizable composition.

Still another embodiment of the invention is the photosensitive thermal recording material in which at least one of the compounds containing an ethylenic unsaturated bond is the compound B.

Still another embodiment of the invention is the photosensitive thermal recording material in which the compound containing an ethylenic unsaturated bond is a color formation-inhibiting compound having, in one molecule, a site which inhibits the reaction of the color-forming component A and the compound B.

Still another embodiment of the invention is the photosensitive thermal recording material in which the recording layers are formed to have a multi-layered structure that comprises a first recording layer which is sensitive to light having a center wavelength of $\lambda_1$ and forms one color, a second recording layer sensitive to light having a center wavelength of $\lambda_2$ and forms a color that differs from the color formed by the first recording layer, . . . an i'th recording layer sensitive to light having a center wavelength of $\lambda_i$ and forms a color that differs from the colors to be formed by the first, second, . . . (i−1) th recording layers, laminated in that order on the support.

DETAILED DESCRIPTION OF THE INVENTION

The photopolymerizable composition of the invention contains a hexaaryl-biimidazole compound sensitive to rays having wavelengths not exceeding 450 nm, and an organoboron compound. The photosensitive thermal recording material of the invention contains at least one recording layer that contains such a hexaaryl-biimidazole compound and an organoboron compound, and thus this recording layer is highly sensitive to rays having wavelengths not exceeding 450 nm. When an organic dye that absorbs light falling within a range of UV rays and visible to IR rays is added thereto, then the material is spectrally sensitized to the light in any desired manner.

The photopolymerizable composition of the invention and the photosensitive thermal recording material comprising it are described in detail hereinunder.

Photopolymerizable Composition:

The photopolymerizable composition of the invention comprises at least one, ethylenic unsaturated bond-containing compound, a hexaaryl-biimidazole compound, and an organoboron compound of the following general formula (1). If desired, it may contain any other component such as an organic dye.

By including a hexaaryl-biimidazole compound, the photopolymerizable composition is made sensitive to rays having wavelengths not exceeding 450 nm. Further, by including such an organoboron compound, the sensitivity of the composition to rays falling within the above range is further increased, and, as a result, the photopolymerization sensitivity of the composition is greatly increased. Basically, since a dye for spectral sensitization is not included in composition, it essentially comprises a hexaaryl-biimidazole compound, and thus there is little yellowing, and even if yellowed, it can be rapidly decolored. When an organic dye is combined with the composition for image recording through exposure to light including UV rays and visible to IR rays, the amount of the organic dye needed may be reduced since the composition contains a hexaarylbiimidazole compound. After image formation, therefore, the organic dye can be rapidly decolored.

The photopolymerizable composition is favorably used as the constituent component of the photosensitive thermal recording material of the invention which is described hereinunder.

Ethylenic Unsaturated Bond-Containing Compound:

The photopolymerizable composition of the invention contains an ethylenic unsaturated bond-containing compound (the compound will be hereinafter referred to as "polymerizable compound").

The polymerizable compound is a polymerizing compound having at least one ethylenic unsaturated double bond in the molecule. The polimerization compound is not particularly limited and any polymerizable compound may be suitably selected for use herein. Examples of the polymerizable compound include acrylic acid derivatives such as acrylates and acrylamides; acrylic acid and its salts; methacrylic acid derivatives such as methacrylates and methacrylamides; methacrylic acid and its salts; maleic anhydride, maleates, itaconic acid, itaconates, styrenes, vinyl ethers, vinyl esters, N-vinyl-heterocyclic compounds, allyl ethers, allyl esters, etc.

The polymerizable compound has one or more olefinic double bonds, and may have a low molecular weight (such as monomers) or a high molecular weight (such as oligomers).

Examples of the double bond-containing monomer include alkyl or hydroxyalkyl acrylates and methacrylates such as methyl acrylate, ethyl acrylate, butyl acrylate, 2-ethylhexyl acrylate, 2-hydroxyethyl acrylate, isobornyl acrylate, methyl methacrylate, and ethyl methacrylate. Also preferred for use herein is silicon acrylate.

Other examples of the monomer are acrylonitrile, acrylamide, methacrylamide, N-substituted (meth) acrylamides: vinyl esters such as vinyl acetate; vinyl ethers such as isobutyl vinyl ether; styrene, alkyl- and halo-styrenes, N-vinylpyrrolidone, vinyl chloride, and vinylidene chloride.

Examples of the monomer having two or more double bonds are diacrylates with ethylene glycol, propylene glycol, neopentyl glycol, hexamethylene glycol or bisphenol A; as well as 4,4'-bis(2-acryloyloxyethoxy)diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate, and tris(2-acryloylethyl) isocyanurate.

Examples of the polyunsaturated compound having a relatively high molecular weight (oligomers) are (meth) acryl-having epoxy resins, (meth)acryl-having polyesters, vinyl ether or epoxy-having polyesters, polyurethanes and polyethers. Other examples of the unsaturated oligomer are unsaturated polyester resins which are generally produced from maleic acid, phthalic acid and one or more diols and have a molecular weight of from 500 to 3000 or so. In addition, also usable herein are vinyl ether monomers and oligomers, as well as polyesters, polyurethanes, polyethers, polyvinyl ethers, and epoxy chain-having, maleate-terminated oligomers. Especially preferred for use herein are combinations of vinyl ether—having oligomers and polymers described in International Patent Laid-Open No. WO90/01512. Also suitable for use herein are copolymers of vinyl ethers and monomers having a functional group derived from maleic acid. The unsaturated oligomers of those types may belong to prepolymers.

Especially preferred examples are esters of ethylenic unsaturated carboxylic acids and polyols or polyepoxides, as well as polymers having an ethylenic unsaturated group in the main chain or in the side chains, for example, unsaturated polyesters, polyamides and polyurethanes and their copolymers, alkyd resins, polybutadiene and butadiene copolymers, polyisoprene and isoprene copolymers, polymers and copolymers having a (meth)acrylic group in the side chains, and also mixtures of two or more such polymers.

Examples of the unsaturated carboxylic acids are unsaturated fatty acids such as acrylic acid, methacrylic acid, crotonic acid, itaconic acid, cinnamic acid, linolic acid and oleic acid. Of those, preferred are acrylic acid and methacrylic acid.

Preferred polyols are aromatic, and especially aliphatic and cycloaliphatic polyols. Examples of the aromatic polyols are hydroquinone, 4,4'-dihydroxydiphenyl, 2,2-di(4-hydroxyphenyl) propane, novolak and resorcinol. Examples of these include the polyepoxides based on these polyols, especially aromatic polyols, and epichlorohydrin. Other preferred polyols are polymers and copolymers having a hydroxyl group in the polymer chain or in the side chains, for example, polyvinyl alcohol and its copolymers, and polyhydroxyalkyl methacrylates and their copolymers. For the polyols, further preferred are hydroxyl-terminated oligoesters.

Examples of the aliphatic and cycloaliphatic polyols are alkylene diols preferably having from 2 to 12 carbon atoms, such as ethylene glycol, 1,2- or 1,3-propanediol, 1,2-, 1,3- or 1,4-butanediol, pentanediol, hexanediol, octanediol, dodecanediol, diethylene glycol, triethylene glycol; polyethylene glycol preferably having a molecular weight of from 200 to 1500, 1,3-cyclopentanediol, 1,2-, 1,3- or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol, and sorbitol.

The polyols may be partially or completely esterified with one carboxylic acid or with different unsaturated carboxylic acids. In the partial esters, the free hydroxyl group may be modified, for example, it may be etherified or esterified with any other carboxylic acid.

The esters include the following: trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylate and methacrylate, glycerol diacrylate and triacrylate, 1,4-cyclohexane diacrylate, bisacrylate and bismethacrylate of polyethylene glycol having a molecular weight of from 200 to 1500, and their mixtures.

Other suitable examples of the polymerizable compound are amides of one or different unsaturated carboxylic acids with aromatic, cycloaliphatic or aliphatic polyamines preferably having from 2 to 6, more preferably from 2 to 4 amino groups.

Examples of the polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-β-aminoethyl ether, diethylenetriamine, triethylenetetramine, and di(β-aminoethoxy)- or di(β-aminopropoxy)ethane. Also preferred are polymers and copolymers having an additional amino group in the side chains, and amino-terminated oligoamides. Examples of the unsaturated amides are methylenebisacrylamide, 1,6-hexamethylenebisacrylamide, diethylenetriamine-trismethacrylamide, bis(methacrylamidopropoxy)ethane, β-methacrylamidoethyl methacrylate, and N-[(β-hydroxyethoxy) ethyl]acrylamide.

The suitable unsaturated polyesters and polyamides are derived from, for example, maleic acid or from diols or diamines. Some of the maleic acid moieties may be substituted with any other dicarboxylic acids. They may be used along with ethylenic unsaturated comonomers, such as styrene. The polyesters and polyamides may be derived from dicarboxylic acids, or from ethylenic unsaturated diols or diamines, especially from those having a relatively long chain with, for example, from 6 to 20 carbon atoms. For their examples, the polyurethanes may be composed of saturated or unsaturated diisocyanates and unsaturated or saturated diols.

Polybutadiene and polyisoprene, and their copolymers are known. Examples of suitable comonomers for them are olefins such as ethylene, propene, butene and hexene, as well as (meth)acrylates, acrylonitrile, styrene and vinyl chloride. Polymers having a (meth)acrylate group in the side chains are also known. For example, they may be reaction products of novolak-based epoxy resin with (meth) acrylic acid, and may also be homo- or copolymers of vinyl alcohol or (meth)acrylic acid with its esterified hydroxyalkyl derivatives. They may also be homo- or copolymers of (meth) acrylates esterified with hydroxyalkyl (meth)acrylates.

The polymerizable compound may have any other functional sites in its structure, depending on the use of the photopolymerizable composition. For example, when the photopolymerizable composition is used in a recording material, the polymerizable compound therein may have a site that promotes or inhibits the reaction of the color-forming component for forming a color in the image area of the material. This will be described hereinunder.

The total content of the ethylenic unsaturated bond-containing compound in the photopolymerizable composition preferably falls between 30.0 and 99.9% by weight, more preferably between 50.0 and 90.0% by weight of the total solid content of the composition.

If the content is smaller than 30.0% by weight, a latent image will not be formed in the step of exposing the recording material to light; but if larger than 99.9% by weight, it will significantly lower the sensitivity of the recording material.

Hexaaryl-biimidazole compound:

The photopolymerizable composition of the invention contains a hexaaryl-biimidazole compound serving as a photopolymerization initiator. The compound is colorless by itself and absorbs little light, but, on the other hand, its ability to generate radicals is high. That is, its radical-generating ability is high. In the composition, therefore, the compound realizes extremely high sensitivity to rays of 450 nm or shorter, and the non-image area (background area) of the photosensitive material that comprises the composition is not colored. That is, the fog density of the material is not increased. In addition, since the compound causes little coloring of the composition, the background area of the photosensitive material comprising the composition can be readily decolored within a short period of time and the compound therefore enables high-speed output of images on the material. Moreover, when combined with an organic dye capable of absorbing light that falls within a range of UV rays and visible to IR rays, the compound further enhances the sensitivity of the combined system to any desired light.

Examples of the hexaaryl-biimidazole compound are given below, but the invention is not limited to these examples. Some hexaaryl-biimidazole compounds employable herein are described, for example, in JP-B Nos. 45-37377, 44-86516 and JP-A No. 2000-221675. Specifically, they are 2,2'-bis(2-chlorophenyl)-4,4'-5,5'-tetrakis (4-methoxycarbonylphenyl)-1,2'-biimidazole, 2,2'-bis (2-chlorophenyl)-4,4',5,5'-tetrakis (4-ethoxycarbonylphenyl)-1,2'-biimidazole, 2,2'-bis (2-chlorophenyl)-4,4',5,5'-tetrakis(4-phenoxycarbonylphenyl-1,2'-biimidazole, 2,2'-bis (2,4-dichlorophenyl)-4,4'-5,5'-tetrakis (4-methoxycarbonylphenyl)-1,2'-biimidazole, 2,2'-bis(2,4-dichlorophenyl)-4,4', 5,5'-tetrakis (4-ethoxycarbonylphenyl)-1,2'-biimidazole, 2,2'-bis(2,4-dichlorophenyl)-4,4',5,5'-tetrakis (4-phenoxycarbonylphenyl)-1,2'-biimidazole, 2,2'-bis (2,4,6-trichlorophenyl)-4,4',5,5'-tetrakis(4-methoxycarbonyl-phenyl-1,2'-biimidazole, 2,2'-bis(2,4,6-trichlorophenyl)-4, 4',5,5'-tetrakis (4-ethoxycarbonylphenyl)-1,2'-biimidazole, 2,2'-bis(2,4,6-trichlorophenyl)-4,4',5,5'-tetrakis (4-phenoxycarbonylphenyl)-1,2'-biimidazole.

Either singly or combined, one or more different types of hexaaryl-biimidazole compounds may be included in the photopolymerizable composition of the invention.

The hexaaryl-biimidazole compound content of the photopolymerizable composition is preferably between 1 and 30% by weight, and more preferably between 5 and 20% by weight of the composition.

If the content is less than 1% by weight, the sensitivity of the composition to rays having wavelengths not exceeding 450 nm is often unsatisfactory; and a content greater than 30% by weight is not desirable since the sensitivity will not be further enhanced.

Organoboron Compound:

The photopolymerizable composition of the invention contains an organoboron compound of formula (1) shown below. By interacting with the hexaaryl-biimidazole compound in the composition, the organoboron compound enhances the sensitivity of the hexaaryl-biimidazole compound to rays which it absorbs, thereby locally promoting the radical-generating ability of the hexaaryl-biimidazole compound. That is, in the exposed area of the composition. Specifically, by combining the organoboron compound with the hexaaryl-biimidazole in the composition, the photosensitivity of the hexaaryl-biimidazole compound to rays having wavelengths not exceeding 450 nm is greatly enhanced. As a result, rapid formation of detailed images on the photosensitive material is possible even when the material is exposed by a light source having a relatively low output. When combined with an organic dye capable of absorbing UV and visible to IR rays, the organoboron compound realizes spectral sensitization of photosensitive materials to any suitably selected light and therefore enables good image formation on the materials exposed using a source of light falling within the above wavelength range.

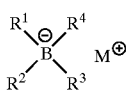
(1)

wherein $R^1$, $R^2$, $R^3$ and $R^4$ each independently represents an aliphatic group, an aromatic group, a heterocyclic group, or a group represented by formula (2) shown below; and M represents a group capable of forming a cation.

In formula (1), $R^1$, $R^2$, $R^3$ and $R^4$ each independently represents an aliphatic group, an aromatic group or a heterocyclic group.

The aliphatic group for $R^1$ to $R^4$ includes, for example, an alkyl group, a substituted alkyl group, an alkenyl group, a substituted alkenyl group, an alkynyl group, a substituted alkynyl group, an aralkyl group, and a substituted aralkyl group. Preferably, the aliphatic group is an alkyl group, a substituted alkyl group, an alkenyl group, a substituted alkenyl group, an aralkyl group, or a substituted aralkyl group, more preferably, an alkyl group or a substituted alkyl group.

The aliphatic group may be a cycloaliphatic group or a linear aliphatic group. The linear aliphatic group may be branched.

The alkyl group may be linear, branched or cyclic. Preferably, it has from 1 to 30 carbon atoms, more preferably from 1 to 20 carbon atoms. The alkyl group may be substituted or unsubstituted. The preferred range for the number of carbon atoms constituting the alkyl moiety in the substituted alkyl group is the same as that mentioned above for the alkyl group.

The alkyl group includes, for example, methyl, ethyl, propyl, butyl, pentyl, hexyl, cyclopentyl, neopentyl, isopropyl, isobutyl, cyclohexyl, octyl, 2-ethylhexyl, decyl, dodecyl and octadecyl groups.

The substituent of the substituted alkyl group includes, for example, a carboxyl group, a sulfo group, a cyano group, a halogen atom (e.g., fluorine, chlorine, bromine), a hydroxyl group, an alkoxycarbonyl group having at most 30 carbon atoms (e.g., methoxycarbonyl, ethoxycarbonyl, benzyloxycarbonyl), an alkylsulfonylaminocarbonyl group having at most 30 carbon atoms, an arylsulfonylaminocarbonyl group, an alkylsulfonyl group, an arylsulfonyl group, an acylaminosulfonyl group having at most 30 carbon atoms, an alkoxy group having at most 30 carbon atoms (e.g., methoxy, ethoxy, benzyloxy, phenethyloxy), an alkylthio group having at most 30 carbon atoms (e.g., methylthio, ethylthio, methylthioethylthioethyl), an aryloxy group having at most 30 carbon atoms (e.g., phenoxy, p-tolyloxy, 1-naphthoxy, 2-naphthoxy), a nitro group, an alkyl group having at most 30 carbon atoms, an alkoxycarbonyloxy group, an aryloxycarbonyloxy group, an acyloxy group having at most 30 carbon atoms (e.g., acetyloxy, propionyloxy), an acyl group having at most 30 carbon atoms (e.g., acetyl, propionyl, benzoyl), a carbamoyl group (e.g., carbamoyl, N,N-dimethylcarbamoyl, morpholinocarbonyl, piperidinocarbonyl), a sulfamoyl group (e.g., sulfamoyl, N,N-dimethylsulfamoyl, morpholinosulfonyl, piperidinosulfonyl), an aryl group having at most 30 carbon atoms (e.g., phenyl, 4-chlorophenyl, 4-methylphenyl, α-naphthyl), an amino group, a substituted amino group (e.g., alkylamino, dialkylamino, arylamino, diarylamino, acylamino), a substituted ureido group, a substituted phosphono group, and a heterocyclic group. Of those, the carboxyl group, the sulfo group, the hydroxyl group and the phosphono group may be in the form of their salts. The cations to form the salts may be those of represented by $M^+$ shown below.

The alkenyl group may be linear, branched or cyclic. Preferably, it has from 2 to 30 carbon atoms, more preferably from 2 to 20 carbon atoms. The alkenyl group may be substituted or unsubstituted. The preferred range for the number of carbon atoms constituting the alkenyl moiety in the substituted alkenyl group is the same as that mentioned above for the alkenyl group.

The examples of the substituent of the substituted alkenyl group are the same as those listed above for the substituted alkyl.

The alkynyl group may be linear, branched or cyclic. Preferably, it has from 2 to 30 carbon atoms, more preferably from 2 to 20 carbon atoms. The alkynyl group may be substituted or unsubstituted. The preferred range for the number of carbon atoms constituting the alkynyl moiety in the substituted alkynyl group is the same as that mentioned above for the alkynyl group.

Examples of the substituent of the substituted alkynyl group are the same as those mentioned above for the substituted alkyl group.

The aralkyl group may be linear, branched or cyclic. Preferably, it has from 7 to 35 carbon atoms, more preferably from 7 to 25 carbon atoms. The aralkyl group may be substituted or unsubstituted. The preferred range for the number of carbon atoms constituting the aralkyl moiety in the substituted aralkyl group is the same as that mentioned above for the aralkyl group.

Examples of the substituent of the substituted aralkyl group are the same as those mentioned above for the substituted alkyl group.

The aromatic group for $R^1$ to $R^4$ includes, for example, an aryl group and a substituted aryl group. Preferably, the aryl group has from 6 to 30 carbon atoms, more preferably from 6 to 20 carbon atoms. The preferred range for the number of carbon atoms constituting the aryl moiety in the substituted aryl groups the same as that mentioned above for the aryl group. Examples of the aryl group include phenyl, α-naphthyl and β-naphthyl groups.

Examples of the substituent of the substituted aryl group are the same as those mentioned above for the substituted alkyl.

The heterocyclic group for $R^1$ to $R^4$ may be substituted or unsubstituted. Examples of the substituent of the substituted heterocyclic group are the same as those mentioned above for the substituted alkyl group for $R^1$ to $R^4$.

Preferably, the heterocyclic group for $R^1$ to $R^4$ contains any of nitrogen, sulfur and oxygen atoms, for example, derived from furan, pyrrole, imidazole, oxazole, thiazole and pyridine rings.

$R^1$ to $R^4$ may also be a group represented by formula (2) which is shown below. In formula (2), $R^5$, $R^6$ and $R^7$ each independently represent an aliphatic group or an aromatic group. Examples of the aliphatic group and the aromatic group are the same as those mentioned hereinabove for $R^1$ to $R^4$; and the preferred examples are also the same.

(2)

In formula (1), two or more of $R^1$, $R^2$, $R^3$ and $R^4$ may be bonded together, either directly or via a substituent, to form a ring. Preferably, the ring, if formed, is selected from the following (C1) to (C3), and is more preferably the ring (C2)

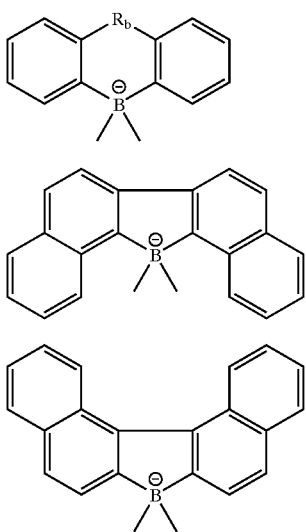

(C1)

(C2)

(C3)

In the ring (C1), $R_b$ represents a divalent group of the following:

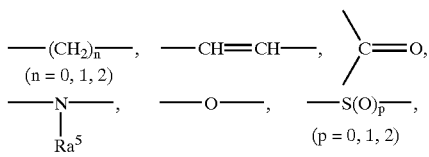

($R_a^5$ is H or a monovalent substituent)

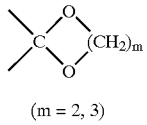

(m = 2, 3)

Of the organoboron compounds of formula (1), preferred are those in which at least one of $R^1$ to $R^4$ is an alkyl group. In view of their ability to ensure high sensitivity and good storage stability, more preferred are triarylalkyl-type organoboron compounds in which one of $R^1$ to $R^4$ is an alkyl group and the other three are aryl groups.

Especially preferred are triarylalkyl-type organoboron compounds in which at least one aryl group is substituted with an electron-attracting group. Even more preferred are those in which the total of the Hammet values (a) of the substituents (electron-attracting groups) of the three aryl groups falls between +0.36 and +2.58.

Examples of the electron-attracting group are preferably a halogen atom and a trifluoromethyl group; and more preferably are fluorine and chlorine atoms.

The aryl group substituted with an electron-attracting group includes, for example, 3-fluorophenyl, 4-fluorophenyl, 2-fluorophenyl, 3-chlorophenyl, 4-chlorophenyl, 3-trifluoromethylphenyl, 4-trifluoromethylphenyl, 3,5-difluorophenyl, 4-bromophenyl, 3,4-difluorophenyl, 5-fluoro-2-methylphenyl, 5-fluoro-4-methylphenyl, 5-chloro-2-methylphenyl and 5-chloro-4-methylphenyl groups.

Examples of the anion moiety in formula (1) include tetramethyl borate, tetraethyl borate, tetrabutyl borate, tri-isobutylmethyl borate, di-n-butyl-di-t-butyl borate, tri-m-chlorophenyl-n-hexyl borate, triphenylmethyl borate, triphenylethyl borate, triphenylpropyl borate, triphenyl-n-butyl borate, trimesitylbutyl borate, tritolylisopropyl borate, triphenylbenzyl borate, tetra-m-fluorobenzyl borate, triphenylphenethyl borate, triphenyl-p-chlorobenzyl borate, triphenylethenylbutyl borate, di (α-naphthyl)-dipropyl borate, triphenylsilyltriphenyl borate, tritoluylsilyltriphenyl borate, tri-n-butyl(dimethylphenylsilyl) borate, diphenyldihexyl borate, tri-i-fluorophenylhexyl borate, tri(5-chloro-4-methylphenyl)hexyl borate, tri-m-fluorophenyl-cyclohexyl borate, and tri(5-fluoro-2-methylphenyl)hexyl borate.

In formula (1), $M^+$ represents a group capable of forming a cation. For this, especially preferred are organic cationic compounds, transition metal-coordinated complex cations (e.g., compounds described in JP 2,791,143) and metal cations (e.g., $Na^+$, $K^+$, $Li^+$, $Ag^+$, $Fe^{2+}$, $Fe^{3+}$, $Cu^+$, $Cu^{2+}$, $Zn^{2+}$, $Al^{3+}$, $½Ca^{2+}$)

Examples of the organic cationic compounds include quaternary ammonium cations, quaternary pyridinium cations, quaternary quinolinium cations, phosphonium cations, iodonium cations, sulfonium cations, and dye cations.

Examples of the quaternary ammonium cations include tetraalkylammonium cations (e.g., tetramethylammonium cation, tetrabutylammonium cation), and tetraarylammonium cations (e.g., tetraphenylammonium cation). Examples of the quaternary pyridinium cations include N-alkylpyridinium cations (e.g., N-methylpyridinium cation), N-arylpyridinium cations (e.g., N-phenylpyridinium cation), N-alkoxypyridinium cations (e.g., 4-phenyl-N-methoxy-pyridinium cation), and N-benzoylpyridinium cations. Examples of the quaternary quinolinium cations include N-alkylquinolinium cations (e.g., N-methylquinolinium cation), and N-arylquinolinium cations (e.g., N-phenylquinolinium cation). Examples of the phosphonium cations include tetraarylphosphonium cations (e.g., tetraphenylphosphonium cation). Examples of the iodonium cations include diaryliodonium cations (e.g., diphenyliodonium cation). Examples of the sulfonium cations include triarylsulfonium cations (e.g., triphenylsulfonium cation).

Other examples of $M^+$ include those compounds described in JP-A 9-188686, paragraphs [0020] to [0038].

In the cationic compounds mentioned above (the examples), the alkyl group preferably has from 1 to 30 carbon atoms. A preferably is an unsubstituted alkyl group such as a methyl, ethyl, propyl, isopropyl, butyl or hexyl group, or a substituted alkyl group such as that mentioned hereinabove for $R^1$ to $R^4$. More preferably, the alkyl group has from 1 to 12 carbon atoms.

In the cationic compounds mentioned above, the aryl group is preferably a phenyl group, a halogen (e.g., chlorine)-substituted phenyl group, an alkyl (e.g., methyl)-substituted phenyl group, or an alkoxy (e.g., methoxy)-substituted phenyl group.

Examples of the organoboron compounds of formula (1) are the compounds described in U.S. Pat. Nos. 3,567,453, 4,343,891, JP-A Nos. 62-143044, 62-150242, 9-188684, 9-188685, 9-188686, 9-188710, JP-B No. 8-9643, and JP-A No. 11-269210, and the compounds mentioned below. For use in the invention, the organoboron compound may be combined with a radical generator mentioned hereinunder. However, the organoboron compounds to be used in the invention are not limited to those specifically referred to herein.

-continued b-18
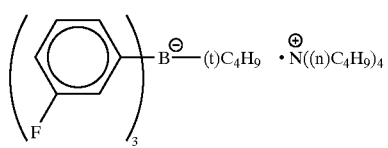

b-19
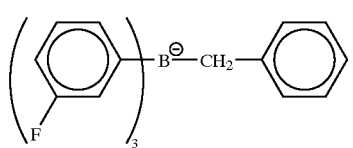

b-20
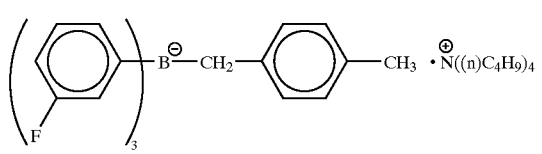

b-21
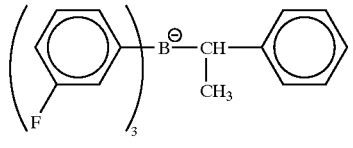

b-22
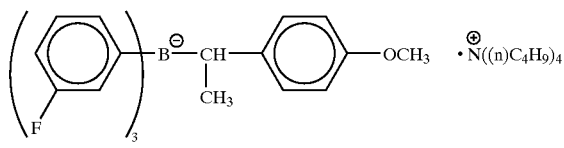

b-23
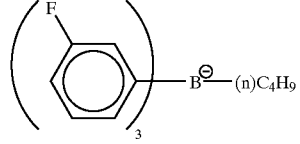

b-24
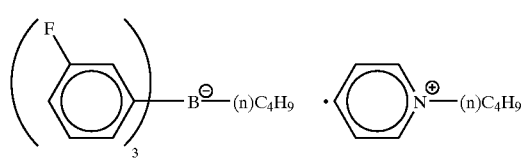

b-25
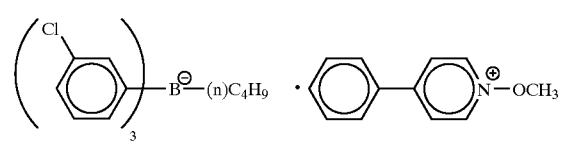

b-26
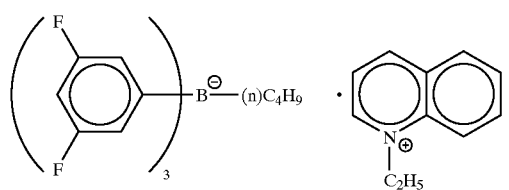

-continued b-27
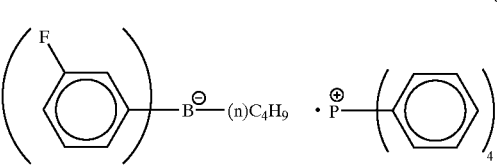

b-28
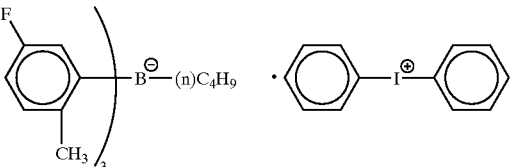

b-29
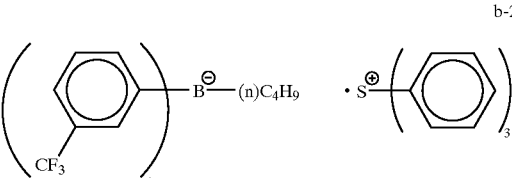

b-30
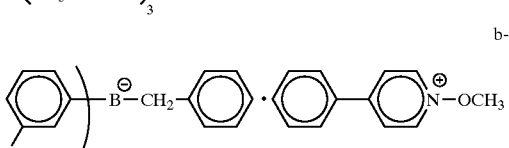

b-31
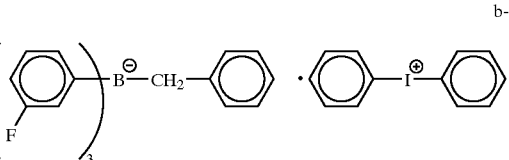

b-32
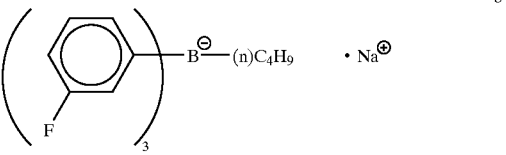

b-33
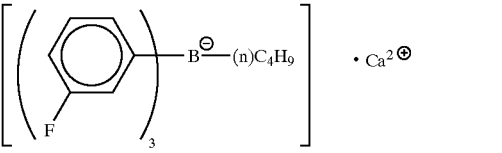

The content of the organoboron compound in the photopolymerizable composition preferably falls between 0.01 and 20% by weight, more preferably between 0.1 and 10% by weight of the content of the ethylenic unsaturated bond-containing compound therein. However, its preferred range varies, depending on the type of the "ethylenic unsaturated bond-containing compound" included in the composition, and therefore is not be limited to the above range.

The photopolymerizable composition may contain a radical generator not having any negative influence on the effect of the invention. The radical generator is described, for example, in Japanese Patent Application No. 36308/1999, paragraphs [0145] to [0151], and Japanese Patent Application No. 34935/2000, paragraphs [0093] to [0102] and [0133] to [0134].

In addition to the above-mentioned components, the photopolymerizable composition may further contain other components such as those mentioned below.

Organic Dye:

Preferably, the photopolymerizable composition contains at least one organic dye. The organic dye may be selected from known compounds, but preferably has a maximum absorption wavelength of from 300 nm to 1000 nm. The organic dye may be any of cationic organic dyes, anionic organic dyes and nonionic organic dyes, and two or more of them may be combined.

Desired dyes are selected from the organic dyes of which the absorption wavelength falls within the range as above, and their absorption wavelengths are so controlled that the dyes are sensitive to the light source to be used. The thus-selected and controlled dyes ensure high sensitivity, and blue to red light sources and IR lasers are favorably selected as the light source for these.

Accordingly, for example, in case where a color image is formed on a multi-color recording material having a laminate structure of monochromatic recording layers in which each recording layer forms a particular color which differs from the colors formed by the others, an organic dye that functions as a spectral sensitizer having a specific absorption wavelength that differs from those of the other organic dyes in the other layers is made to exist in each monochromatic layer that forms a particular color which differs from the colors formed by the others, and the recording material is exposed to a source of light that corresponds to the absorption wavelengths of the organic dyes therein. It is thus ensured that even in the recording material having such a laminate of different recording layers, each recording layer (which forms one color) forms a particular color which differs from those formed by the others, and thus a sharp multi-color image can be formed on the recording material. The multi-color recording material of the type has high sensitivity and forms a sharp multi-color image thereon.

Examples of the organic dyes usable herein are described, for example, in patent publications relating to "organoboron compounds" mentioned below, and in Research Disclosure, Vol. 200, December 1980, Item 20036, and Sensitizers (pp. 160–163, published by Kodan-sha, edited by Katsumi Tokumaru and Shin Okawara, 1987).

Specifically, they are 3-ketocoumarin compounds described in JP-A No. 58-15603; thiopyrylium compounds described in JP-A No. 58-40302; naphthothiazole-merocyanine compounds described in JP-B Nos. 59-28328, 60-53300; merocyanine compounds described in JP-B Nos. 61-9621, 62-3842, JP-A Nos. 59-89303, 60-60104; thiobarbituric acid-containing merocyanine dyes, hemioxanole dyes, indolenine nucleus-having cyanine, hemicyanine and merocyanine dyes described in JP-A Nos. 62-150242, 64-59345, JP-B No. 8-9643, Japanese Patent Application Nos. 11-20089, 11-323838, 11-367432, 2000-34935, 2000-388861, 2000-38872, 2000-142112.

Also mentioned are dyes described in *Chemistry of Functional Dyes* (1981, published by CMC Publishing, pp. 393–416), and *Colorants* (60 [4] 212–224, 1987). Specifically, they are cationic methine dyes, cationic carbonium dyes, cationic quinonimine dyes, cationic indoline dyes, and cationic styryl dyes.

Examples of the organic dyes include merocyanine dyes, coumarin skeleton-containing dyes, merostyryl dyes, oxonole dyes, hemioxonole dyes, triarylmethane dyes, xanthene dyes, anthracene dyes, rhodamine dyes, acridine dyes, aniline dyes, azo dyes, azomethine dyes, cyanine dyes, carbocyanine dyes, dicarbocyanine dyes, tricarbocyanine dyes, hemicyanine dyes, styryl dyes, azine dyes, oxazine dyes, thiazine dyes, quinoline dyes, thiazole dyes and other quinonimine dyes. The cationic dyes such as cyanine dyes, hemicyanine dyes and styryl dyes are preferably substituted with an electron-attracting group, as their sensitivity is high.

Of the organic dyes mentioned above, preferred are nonionic dyes in view of their sensitivity; and more preferred are merocyanine dyes and coumarin skeleton-containing dyes.

Examples (1-1 to 3-17) of the cationic, anionic and nonionic organic dyes are shown below. The invention, however, is not limited to these examples.

Examples of Cationic Organic Dye:

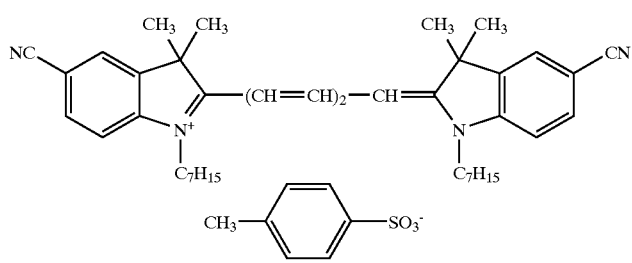

1-1

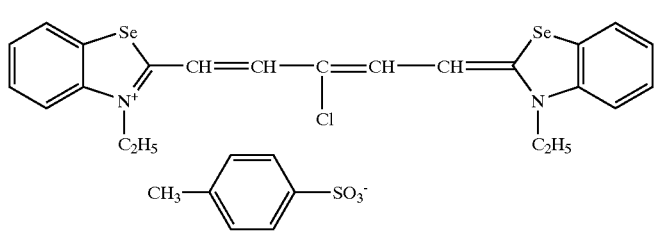

1-2

-continued
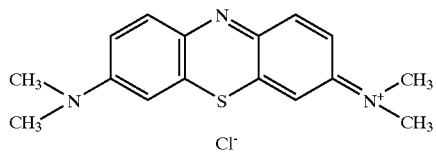
1-3
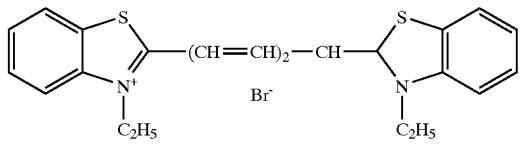
1-4
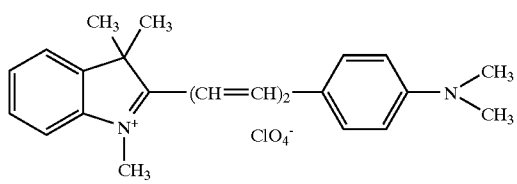
1-5
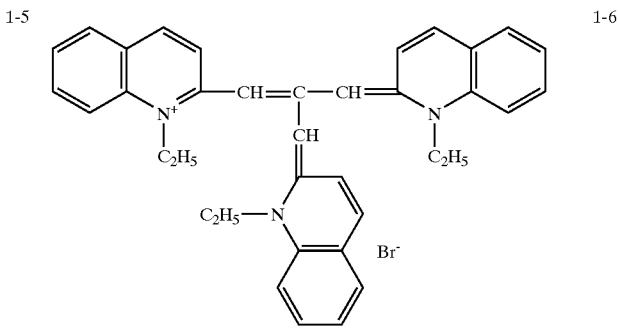
1-6
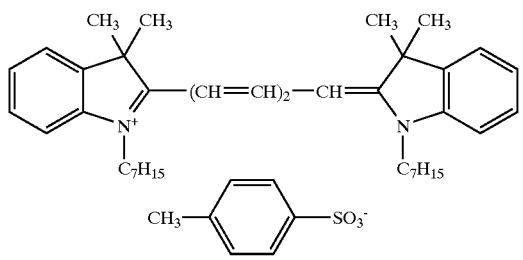
1-7
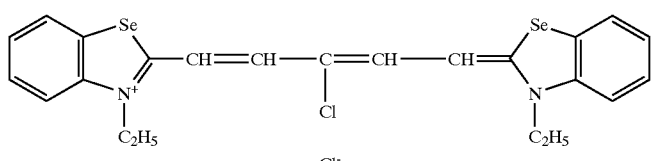
1-8
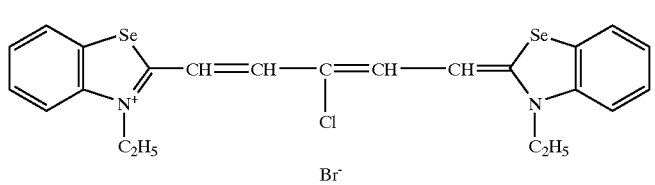
1-9
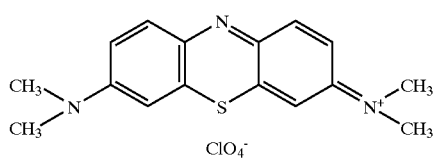
1-10
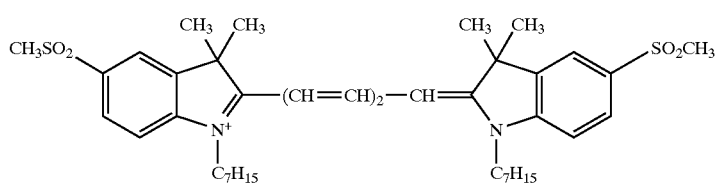
1-11

-continued
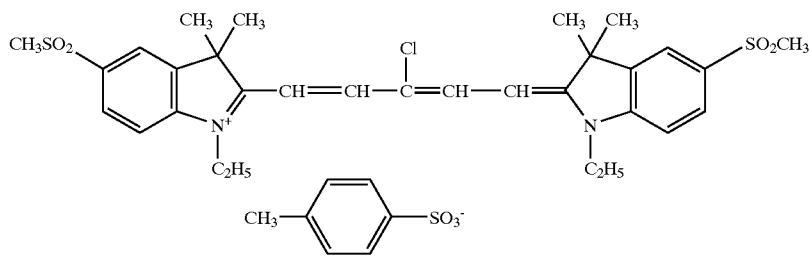
1-12
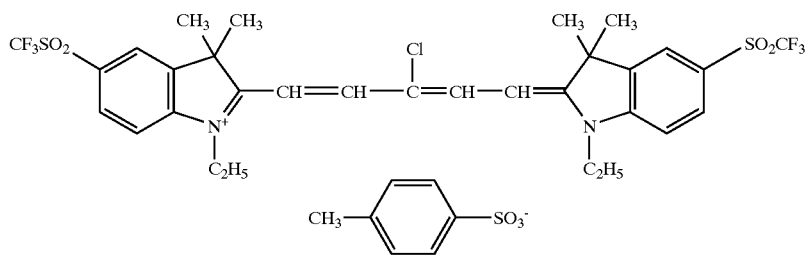
1-13
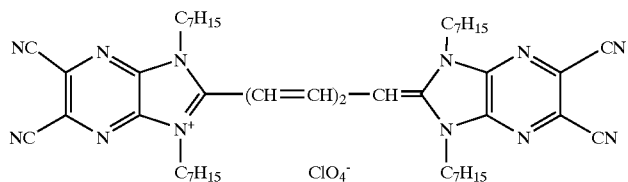
1-14
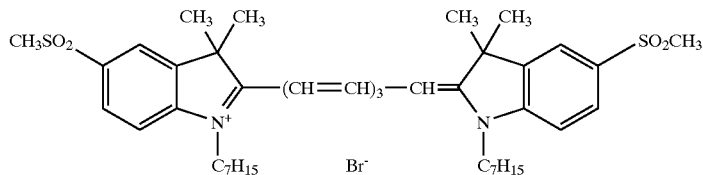
1-15
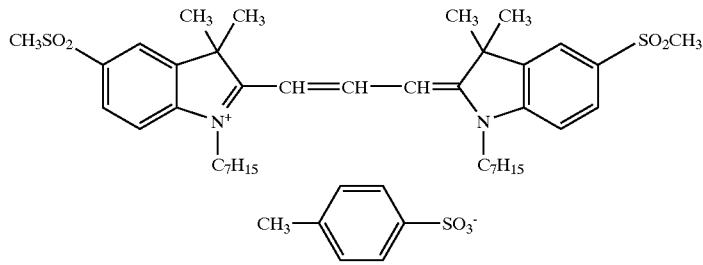
1-16
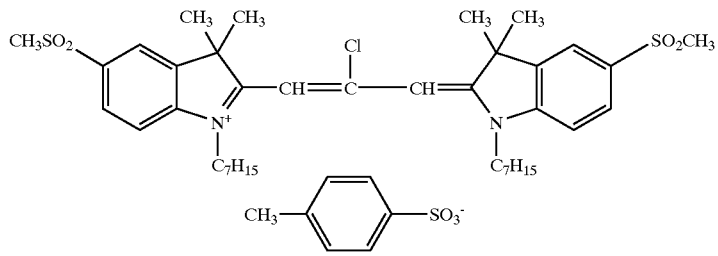
1-17

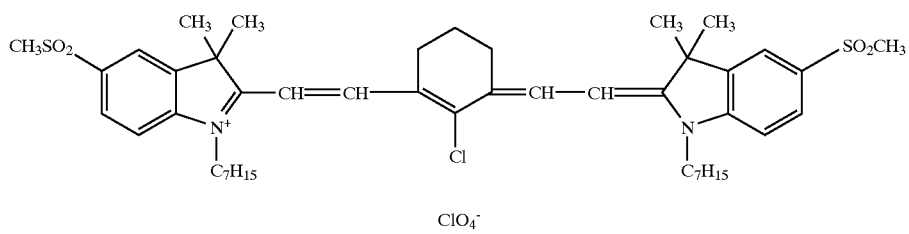
1-18
Examples of Anionic Organic Dye:
2-1
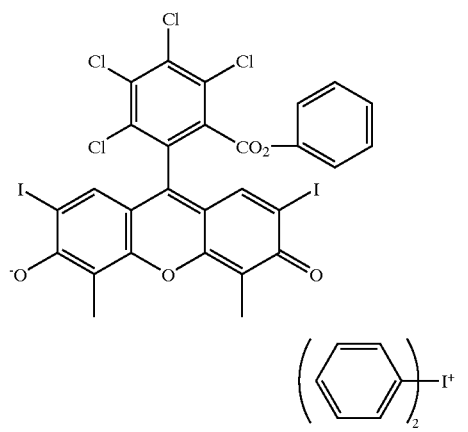
2-1
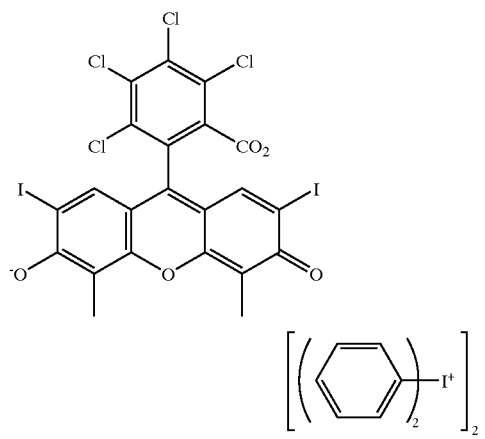
2-3
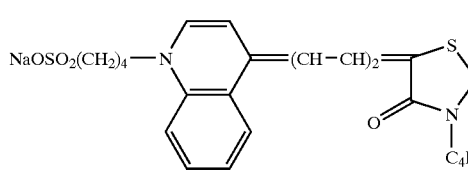
2-4
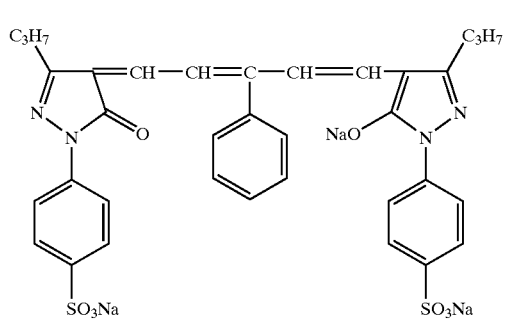
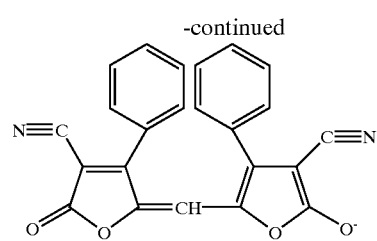
Examples of Nonionic Organic Dye:
3-1
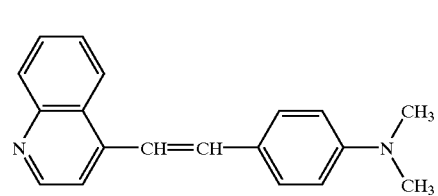
3-2
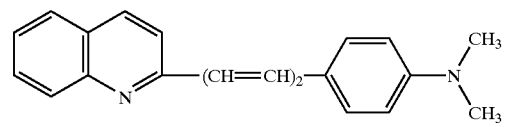
3-3
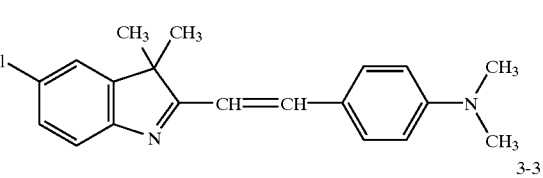
3-3
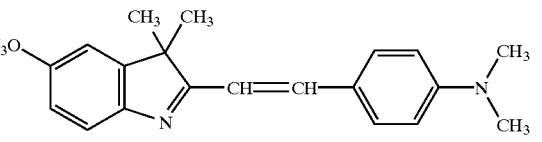
3-3
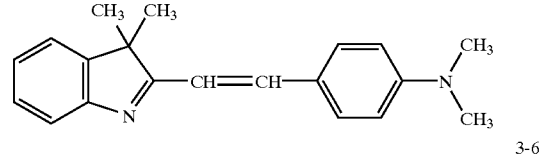
3-6
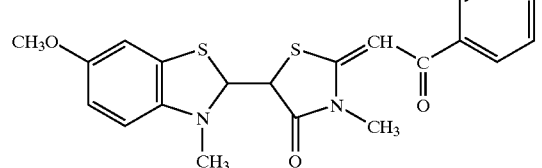

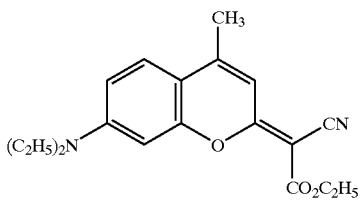

3-7

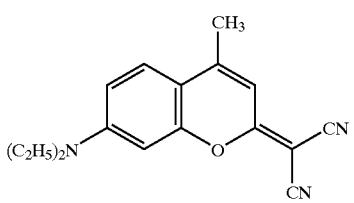

3-8

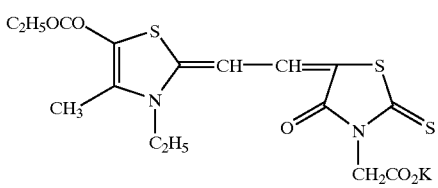

3-9

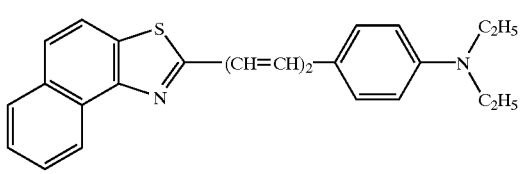

3-10

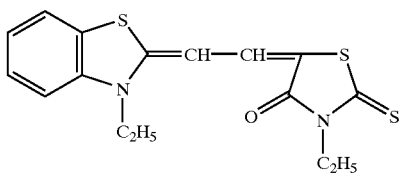

3-11

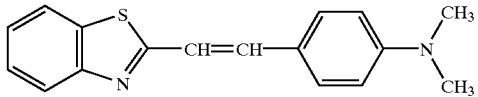

3-12

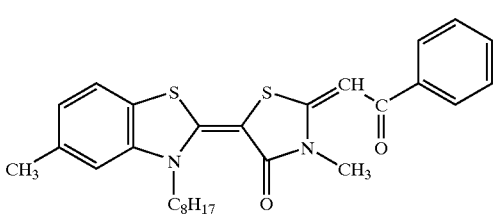

3-13

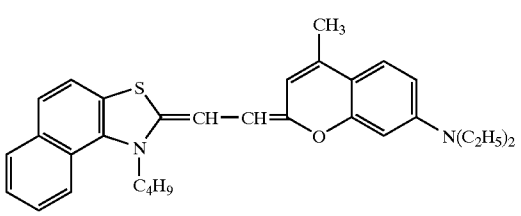

3-14

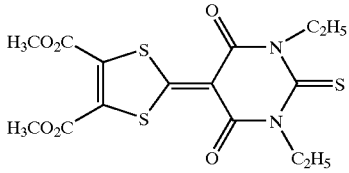

3-15

3-16

3-17

By appropriately using the organic dyes shown above, the spectral sensitivity of the photopolymerizable composition of the invention can be controlled in any desired manner, and the composition can be sensitized to even UV rays or IR rays.

The amount of the organic dye to be included in the photopolymerizable composition is not specifically defined, but preferably falls between 0.05 and 3% by weight, more preferably between 0.1 and 1% by weight of the overall weight of the composition.

Color-Forming Component:

If desired, the photopolymerizable composition may contain a color-forming component. The compounds usable as the color-forming component are the same as those usable in the photosensitive thermal recording material described hereinunder.

Preferably, the amount of the color-forming component to be included in the photopolymerizable composition falls between 1 and 30% by weight, more preferably between 5 and 20% by weight of the overall weight of the composition.

Organic Base:

In case the photopolymerizable composition contains such a color-forming component along with a coupler compound, it may additionally contain an organic base that acts to promote the coupling reaction of the two. The organic base includes, for example, tertiary amines, piperidines, piperazines, amidines, formamidines, pyridines, guanidines, and morpholines. Specifically, they are described in JP-A Nos. 57-123086, 60-49991, 60-94381, 9-71048, 9-77729, 9-77737.

The amount of the organic base to be in the composition is not specifically defined, but preferably falls between 1 and 30 mols per mol of the diazonium salt included therein.

Color-Forming Reaction Promoter:

In case where the photopolymerizable composition contains the above-mentioned color-forming component and a substantially colorless compound having a site that reacts with the color-forming component to form a color, the photopolymerizable composition may additionally contain a color-forming reaction promoter that promotes the color-forming reaction.

Examples of the color-forming reaction promoter includes, for example, phenol derivatives, naphthol derivatives, alkoxy-substituted benzenes, alkoxy-substituted naphthalenes, hydroxy compounds, carboxylic acid amide compounds, and sulfonamide compound. Since these compounds have the ability to lower the melting point of coupler compounds and organic bases or the ability to increase the transmittance of heat through microcapsule walls, it is believed that they ensure higher color density.

Binder:

Also if desired, the photopolymerizable composition may contain a binder. In case where the composition is a liquid or viscous substance, adding a binder thereto is preferred. The binder content of the photopolymerizable composition preferably falls between 5 and 95% by weight, more preferably between 10 and 90% by weight, and most preferably between 15 and 85% by weight of the total solid content of the composition.

For the binder, preferred are polymers having a molecular weight of from about 5000 to 2000000, more preferably from about 10000 to 1000000. Examples include acrylate and methacrylate homo- or copolymers (e.g., methyl methacrylate/ethyl acrylate/methacrylic acid copolymers, poly(alkyl methacrylates), poly(alkyl acrylates)), cellulose esters or cellulose ethers (e.g., cellulose acetate, cellulose acetobutyrate, methyl cellulose, ethyl cellulose), polyvinyl butyrals, polyvinyl formals, cyclic rubbers, polyethers (e.g., polyethylene oxide, polypropylene oxide, polytetrahydrofuran), polystyrenes, polycarbonates, polyurethanes, polychloro-olefins, polyvinyl chlorides, vinyl chloride/vinylidene chloride copolymers, vinylidene chloride/acrylonitrile copolymers, methyl methacrylate, vinyl acetate, polyvinyl acetates, copoly(ethylene/vinyl acetates), polycaprolactams, poly(hexamethylenadipamides), polyesters (e.g., poly(ethylene glycol terephthalate, poly(hexamethylene glycol succinate)), polyamides, and polyurethanes.

Also usable for the binder are water-soluble polymers such as gelatins, (modified) polyvinyl alcohols, polyvinyl pyrrolidones, hydrolyzates of styrene-maleic acid copolymers, sodium polystyrenesulfonates and sodium alginates. In addition, also usable are latexes such as styrene-butadiene rubber latexes, acrylonitrile-butadiene rubber latexes, methyl acrylate-butadiene rubber latexes.

An unsaturated compound may also be used herein, in the form of a mixture with a non-photopolymerizable film-forming component. For example, it may be a physically-dried polymer or a polymer solution in an organic solvent, including, for example, nitrocellulose and cellulose actobutyrate. However, they may be chemically and/or thermally-curable (thermosetting) resins, such as polyisocyanates, polyepoxides, melamine resins, as well as polyimide precursors. Using such a thermosetting resin along with the photopolymerizable composition is important when using the composition in known hybrid systems that are photopolymerized in a first stage and then crosslinked through thermal post-treatment in a second stage.

The photopolymerizable composition of the invention may be produced by adding the above-mentioned component to a solvent along with a water-soluble polymer, and dispersing them in dry in a ball mill or the like or emulsifying them along with a suitable emulsifier to form an emulsion. The above-mentioned binders, and also other water-soluble polymers such as those to be used to form the aqueous phase in encapsulation mentioned below may be used as the water-soluble polymer. The solvent may be any solvent usable in forming recording layers. The method of dry dispersion or emulsification is not specifically defined, and any known methods may be used. The details of the methods are described in JP-A 59-190886, 2-14127, 7-17145.

As mentioned hereinabove, the combination of the hexaaryl-biimidazole compound serving as a photopolymerization initiator and the organoboron compound to be included in the photopolymerizable composition of the invention greatly enhances the photopolymerization sensitivity of the composition to light whose wavelength does not exceed 450 nm, and thus significantly inhibits the coloration in non-coloring regions. Accordingly, even when a relatively low output source of rays having wavelengths not exceeding 450 nm is used, the composition enables rapid formation of detailed and high-contrast images with reduced fog density. In a case where organic dyes capable of absorbing predetermined rays that fall within a range of UV rays and visible to IR rays are used along with the composition, spectral sensitization to the predetermined rays and therefore image formation on recording materials exposed to a light source falling within the wavelength range is enabled.

Photosensitive Thermal Recording Material:

The photosensitive thermal recording material of the invention has, on a support, one or more recording layers, in which at least one recording layer contains a compound that polymerizes to be thereby cured, a hexaaryl-biimidazole compound, and an organoboron compound. The recording material may be a monochromatic or multi-color recording material. The multi-color recording material has at least one recording layer sensitive to rays having wavelengths not exceeding 450 nm, and at least one recording layer sensitive to rays longer than 450 nm. In addition, it may have other layers such as interlayers, protective layers, etc. Two or more interlayers may be in the material, and the protective layer therein may have a single-layered structure or a multi-layered structure comprising two or more layers.

The basic constitution of the photosensitive thermal recording material of the invention is not specifically defined, and may be suitably modified in accordance with the object of the invention.

One embodiment of the basic structure of the photosensitive thermal recording material of the invention is described below. It may, for example, be a positive image-forming material containing a color-forming component A encapsulated in thermo-responsive microcapsules.

Specifically, when the positive image-forming, photosensitive thermal recording material of this embodiment is exposed imagewise to light, the radical generator in the photopolymerizable composition therein generates radicals in the exposed area, and, at the same time, the polymerizable compound in the composition starts to polymerize and is cured in that area. As a result, the photopolymerizable composition is fixed in the exposed area to form a latent image. In that condition, no substances pass through the walls of the microcapsules at room temperature, and the color-forming component A existing in the microcapsules is not brought into contact with the compound B having, in the molecule, a site which reacts with the color-forming component A to form a color and which exists outside the microcapsules. At this stage, therefore, no color is formed in the material.

Next, the entire surface of the photosensitive thermal recording material is exposed to heat, and the microcapsules in the material become permeable. At this stage, therefore, the compound B in the non-exposed area of the material moves into the microcapsules (and/or the color-forming component A therein moves out of the microcapsules), and the color-forming component A thus reacts with the compound B to form a color only in the non-exposed area of the material. On the other hand, in the exposed area of the material, the photopolymerizable composition has been polymerized and cured, and is fixed therein. In this area, therefore, the color-forming component A and the compound B are both immobilized and the two do not contact with each other. That is, no color is formed in the exposed area. After having been thus processed, the surface of the material is wholly exposed to light, whereby the region of the material which was not polymerized is polymerized (fixed) and the dye component in the photopolymerizable composition in the material is decolored.

Other embodiments of the photosensitive thermal recording material of the invention are described below, and these are referred to as the first and second embodiments of the material. Any suitable method of image formation may be used.

In the first embodiment of the material, at least one of the polymerizable compound in the photopolymerizable composition is the compound B itself, and the recording layer contains at least the color-forming component A and the photopolymerizable composition of the invention that contains the compound B capable of reacting with the component A to form a color. This embodiment is applied to a positive image-forming, photosensitive thermal recording material having the above-mentioned basic structure. As mentioned hereinabove, the compound B has a site capable of reacting with the color-forming component A to form a color, and has an ethylenic unsaturated bond. When exposed imagewise to light, the compound B starts to polymerize and is cured, and is thus fixed in situ to form a latent image in the exposed area of the material. Accordingly, in the exposed area of the material, the compound B is immobilized and does not contact the color-forming component A. That is, no color is formed in the exposed area.

In the second embodiment of the material, the recording layer contains at least the color-forming component A, the compound B capable of reacting with the component A to form a color, and the photopolymerizable composition of the invention. In this embodiment, the ethylenic unsaturated bond-containing compound (polymerizable compound) in the photopolymerizable composition is a color formation-inhibiting compound which has, in one molecule, a site which inhibits the reaction of the color-forming component A and the compound B (that is, a reaction-inhibiting site).

Hereinunder described is one example in which the photosensitive thermal recording material of this embodiment used as a negative image-forming, photosensitive thermal recording material that contains the color-forming component A encapsulated in thermo-responsive microcapsules.

In the negative image-forming, photosensitive thermal recording material of this embodiment, no substances pass through the walls of the microcapsules at room temperature, like in the material of the above-mentioned first embodiment. In this, therefore, the color-forming component A does not contact the compound B, and no color is formed. When the material is exposed imagewise by light, the polymerizable compound in the exposed area of the material starts to polymerize and is cured, and thus fixed in situ to thereby form a latent image in the exposed area. Next, the entire surface of the material is exposed to heat, and the microcapsules in the material become penetrable. At this stage, the compound B moves into the microcapsules (and/or the color-forming component A moves out of the microcapsules), and, at the same time, the polymerizable compound moves into the microcapsules and acts as a color formation-inhibiting compound in the non-exposed area of the material. In the non-exposed area, therefore, the color-forming reaction between the component A and the compound B is inhibited, and no color is formed therein. On the other hand, the polymerizable compound (serving as a color formation-inhibiting compound) in the exposed area of the material has polymerized and is thus fixed therein. In the exposed area, therefore, the polymerizable compound does not react with the color-forming component A and the compound B, and a color is formed only in the exposed area of the material without the polymerizable compound affecting the color. After having been thus processed, the entire surface of the photosensitive thermal recording material is exposed to light, and the dye in the photopolymerizable composition is decolored.

The light source for image formation on the photosensitive thermal recording material of the invention may be the same as those mentioned hereinabove for exposure to light of the photopolymerizable composition of the invention.

The layers constituting the photosensitive thermal recording material of the invention are described below.

Recording Layer:

In the photosensitive thermal recording material of the invention, at least one recording layer contains (1) a color-forming component A encapsulated in thermo-responsive microcapsules, (2) a substantially colorless compound B which has a site which reacts with the color-forming component A to form a color and which exists outside the thermo-responsive microcapsules (this will be hereinafter referred to as "color-forming component B"), and (3) the photopolymerizable composition of the invention mentioned hereinabove. Specifically, the recording layer comprises a hexaaryl-biimidazole compound and an organoboron compound, optionally containing an organic dye, and it is sensitive to rays having wavelengths not exceeding 450 nm or to rays longer than 450 nm. If desired, the recording layer may be a multi-layered, multi-color image-recording layer that comprises a combination of two or more such layers.

To form the recording layer thereon, a support is coated with a coating liquid that contains the above-mentioned components. After being coated, the recording layer is exposed imagewise to light to which the respective recording layers are sensitive to thereby forma latent image thereon (exposing step), then the recording layer is heated whereby the color-forming component in each recording layer therein forms a color corresponding to the latent image to give a color image (color-forming step), and its surface is further exposed to light to fix the image thereon and to decolor the dye component in each layer (fixing step), in the manner mentioned hereinabove. Through the process of image formation, desired image is formed on the recording material.

The preferred embodiments of the photopolymerizable composition to be included in each recording layer of the photosensitive thermal recording material and details thereof, are given in the previous section that describes the photopolymerizable composition of the invention.

The amount of the photopolymerizable composition to be included in one recording layer of the material preferably falls between 1 and 30 $g/m^2$, more preferably between 2 and 10 $g/m^2$. If the amount of the polimerizable composition is less than 1 $g/m^2$, the material will not have a satisfactory degree of color density; but if it is greater than 30 $g/m^2$, the coatability of the coating liquid for the recording layer will be poor.

Color-Forming Component:

The color-forming component to be included in the recording layer is described below.

In the photosensitive thermal recording material of the invention, the recording layer contains the above-mentioned color-forming component A and compound B (color-forming component B) both serving as a color source, along with the above-mentioned photopolymerizable composition. The first embodiment of the photosensitive thermal recording material mentioned above contains the color-forming component A along with the photopolymerizable composition, and the polymerizable compound in the photopolymerizable composition therein is the color-forming component B which reacts with the component A to form a color.

Examples of the combination of the color-forming components A and B both serving as a color source to form an image are the following (a) to (s). In these combinations, the color-forming components A and B are in that order.

(a) A combination of an electron-donating dye precursor, and an electron-receiving compound.

(b) A combination of a diazo compound, and a coupling component (hereinafter referred to as "coupler compound").

(c) A combination of a metal salt of an organic acid such as silver behenate or silver stearate, and a reducing agent such as protocatechic acid, spiroindane or hydroquinone.

(d) A combination of an iron salt of a long-chain fatty acid such as ferric stearate or ferric myristate, and a phenol such as tannic acid, gallic acid or ammonium salicylate.

(e) A combination of a heavy metal salt of an organic acid, such as nickel, cobalt, lead, copper, iron, mercury or silver acetate, stearate or palmitate, and an alkali metal or alkaline earth metal sulfide such as calcium sulfide, strontium sulfide or potassium sulfide; or a combination of the above-mentioned heavy metal salt of an organic acid, and an organic chelating agent such as s-diphenylcarbazide or diphenylcarbazone.

(f) A combination of a heavy metal sulfate such as silver, lead, mercury or sodium sulfate, and a sulfur compound such as sodium tetrathionate, sodium thiosulfate or thiourea.

(g) A combination of a ferric salt of a fatty acid such as ferric stearate, and an aromatic polyhydroxy compound such as 3,4-dihydroxytetraphenylmethane.

(h) A combination of a metal salt of an organic acid such as silver oxalate or mercury oxalate, and an organic polyhydroxy compound such as polyhydroxyalcohol, glycerin or glycol.

(i) A combination of a ferric salt of a fatty acid such as ferric pelargonate or ferric laurate, and a thiocetylcarbamide or isothiocetylcarbamide derivative.

(j) A combination of a lead salt of an organic acid such as lead caproate, lead pelargonate or lead behenate, and a thiourea derivative such as ethylenethiourea or N-dodecylthiourea.

(k) A combination of a heavy metal salt of a higher fatty acid such as ferric stearate or copper stearate, and a zinc dialkyldithiocarbamate.

(l) A combination to form an oxazine dye, such as a combination of resorcinol and a nitroso compound.

(m) A combination of a formazane compound, and a reducing agent and/or a metal salt.

(n) A combination of a protected dye (or leuco dye) precursor, and a deprotecting agent.

(o) A combination of an oxidizable color former, and an oxidizing agent.

(p) A combination of a phthalonitrile and a diiminoisoindoline. (This is a combination which forms a phthalocyanine.)

(q) A combination of an isocyanate and a diiminoisoindoline. (This is a combination which forms a color pigment.)

(r) A combination of a pigment precursor, and an acid or a base. (This is a combination which forms a pigment.)

(s) A combination of an oxidation product precursor of a paraphenylenediamine derivative or a paraaminophenol derivative, and a coupling component (coupler compound).

Of the combinations of two components to serve as a color source, preferred are the combination (b) of a diazo compound and a coupling component (hereinafter referred to as "coupler compound"); the combination (n) of a protected dye (or leuco dye) precursor and a deprotecting agent; and the combination (s) of an oxidation product precursor of a paraphenylenediamine derivative or a paraaminophenol derivative, and a coupling component (coupler compound).

The electron-donating, colorless dye precursor for the color-forming component A may be any and every known compound used for thermal recording paper or pressure-sensitive recording paper, including, for example, phthalide compounds, fluoran compounds, phenothiazine compounds, indolylphthalide compounds, leucoauramine compounds, rhodamine-lactam compounds, triphenylmethane compounds, triazene compounds, spiropyran compounds, pyridine compounds, pyrazine compounds, and fluorene compounds.

Examples of the phthalide compounds include those described in U.S. Pat. No. (reissued) 23,024, U.S. Pat. Nos. 3,491,111, 3,491,112, 3,491,116, and 3,509,174. Specifically, they are 3,3-bis (p-dimethylaminophenyl)-6-dimethylaminophthalide, 3,3-bis (p-diethylaminophenyl) phthalide, 3,3-bis(2-methyl-1-octylindol-3-yl) phthalide, 3-(4-dipropylamino-2-acetylaminophenyl)-3-(2-methyl-1-octylindol-3-yl)-4-azaphthalide, 3-(4-diethylamino-2-ethoxyphenyl)-3-(2-methyl-1-octylindol-3-yl) phthalide, 3-(4-diethylamino-2-ethoxyphenyl)-3-(2-methyl-1-octylindol-3-yl)-4-azaphthalide, 3-(4-diethylamino-2-methylphenyl)-3-(1-ethyl-2-methylindol-3-yl)-4-azaphthalide, 3,3-bis(4-diethylamino-2-butyloxyphenyl)-4-azaphthalide, and 3-(4-diethylamino-2-butyloxyphenyl)-3-(2-methyl-1-pentylindol-3-yl)-4-azaphthalide.

Examples of the fluoran compounds include those described in U.S. Pat. No. 3,624,107, 3,627,787, 3,641,011, 3,462,828, 3,681,390, 3,920,510 and 3,959,571. Specifically, these examples include 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-methyl-6-N-ethyl-N-isobutylaminofluoran, 2-anilino-6-dibutylaminofluoran, and 2-anilino-3-methyl-6-N-methyl-N-tetrahydrofurfurylaminofluoran.

Examples of the thiazine compounds are benzoyl-leucomethylene blue, and p-nitrobenzyl-leucomethylene blue.

Examples of the leucoauramine compounds are 4,4'-bis-dimethylaminobenzhydryl benzyl ether, N-halophenyl-leucoauramine, and N-2,4,5-trichlorophenyl-leucoauramine.

An example of the rhodamine-lactam compounds is rhodamine-B-anilinolactam.

Examples of the spiropyran compounds are those described in U.S. Pat. No. 3,971,808. Specifically, these examples include 3-methyl-spiro-dinaphthopyran, 3-ethyl-spiro-dinaphthopyran, 3,3'-dichloro-spiro-dinaphthopyran, 3-benzylspiro-dinaphthopyran, 3-methyl-naphtho-(3-methoxy-benzo) spiropyran, and 3-propyl-spiro-dibenzopyran.

Examples of the pyridine compounds and the pyrazine compounds are those described in U.S. Pat. Nos. 3,775,424, 3,853,869 and 4,246,318.

Examples of the fluorene compounds are those described in Japanese Patent Application No. 61-240989.

The cyan, magenta and yellow color-forming dye precursors which may be used are those described in U.S. Pat. No. 4,800,149.

The yellow color-forming, electron-donating dye precursors which may be used are those described in U.S. Pat. Nos. 4,800,148, 5,126,233, and JP-B No. 7-88105; and the cyan color-forming, electron-donating dye precursors may also be those described in JP-A No. 63-53542.

The electron-donating dye precursor, when used, is combined with an electron-receiving compound for the color-forming component B to make the electron-donating dye precursor form a color.

The electron-receiving compound may be any and every known compound for use in thermal recording paper and pressure-sensitive recording paper, including, for example, phenol derivatives, salicylic acid derivatives, metal salts of aromatic carboxylic acids, acidic clay, bentonite, novolak resins, metal-processed novolak resins, and metal complexes. Specifically, they are described in JP-B Nos. 40-9309, 45-14039, and JP-A Nos. 52-140483, 48-51510, 57-210886, 58-87089, 59-11286, 60-176795, 61-95988.

Examples of the phenol derivatives include 2,2-bis(4-hydroxyphenyl) propane, 1,1-bis(3-chloro-4-hydroxyphenyl) cyclohexane, 4-hydroxyphenyl-4'-isopropyloxyphenylsulfone, bis(3-allyl-4-hydroxyphenyl) sulfone, α, α'-bis(4-hydroxyphenyl)-1,4-diisopropyl-benzene, and benzyl p-hydroxybenzoate.

The salicylic acid derivatives include, for example, 4-pentadecylsalicylic acid, 3,5-di(α-methylbenzyl)salicylic acid, 3,5-di(tert-octyl)salicylic acid, 5-octadecylsalicylic acid, 5-α-(p-α-methylbenzylphenyl)ethylsalicylic acid, 3-α-methylbenzyl-5-tert-octylsalicylic acid, 5-tetradecylsalicylic acid, 4-hexadecylsalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, and their salts with zinc, aluminium, calcium or copper.

In the first embodiment of the photosensitive thermal recording material mentioned above, the color-forming component B serves also as an ethylenic unsaturated bond-containing compound. In this embodiment, therefore, at least one polymerizable compound is an electron-receiving compound, which has both an electron-receiving group and an ethylenic unsaturated bond (hereinafter referred to as "polymerizing group") in one molecule.

In this case, the compounds for the color-forming component B may be produced, for example, with reference to 3-halo-4-hydroxybenzoic acids described in JP-A No. 4-226455; methacryloxyethyl esters or acryloxyethyl esters of hydroxyl-containing benzoic acids described in JP-A No. 63-173682; hydroxy-containing benzoates with hydroxymethylstyrene described in JP-A Nos. 59-83693, 60-141587, 62-99190; hydroxystyrenes described in EP 29323; N-vinylimidazole complexes with zinc halides described in JP-A Nos. 62-167077, 62-16708; and electron-receiving compounds described in JP-A No. 63-317558.

Of the compounds having both an electron-receiving group and a polymerizing group in one molecule, preferred are 3-halo-4-hydroxybenzoates of the following general formula:

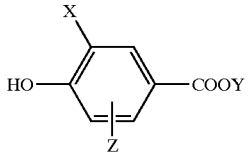

In the formula, X represents a halogen atom, and is preferably a chlorine atom. Y represents a polymerizing ethylene-containing monovalent group, and is preferably a vinyl-containing aralkyl group, an acryloyloxyalkyl group or a methacryloyloxyalkyl group, more preferably an acryloyloxyalkyl group having from 5 to 11 carbon atoms, or a methacryloyloxyalkyl group having from 6 to 12 carbon atoms. Z represents a hydrogen atom, an alkyl group or an alkoxy group.

Examples of the halo-4-hydroxybenzoates include, for example, vinylphenethyl 3-chloro-4-hydroxybenzoate, vinylphenylpropyl 3-chloro-4-hydroxybenzoate, (2-acryloyloxyethyl) 3-chloro-4-hydroxybenzoate, (2-methacryloyloxyethyl) 3-chloro-4-hydroxybenzoate, (2-acryloyloxypropyl) 3-chloro-4-hydroxybenzoate, (2-methacryloyloxypropyl) 3-chloro-4-hydroxybenzoate, (3-acryloyloxypropyl) 3-chloro-4-hydroxybenzoate, (3-methacryloyloxypropyl) 3-chloro-4-hydroxybenzoate, (4-acryloyloxybutyl) 3-chloro-4-hydroxybenzoate, (4-methacryloyloxybutyl) 3-chloro-4-hydroxybenzoate, (2-acryloyloxyethyl) 3-chloro-4-hydroxybenzoate, (5-acryloyloxypentyl) 3-chloro-4-hydroxybenzoate, (5-methacryloyloxypentyl) 3-chloro-4-hydroxybenzoate, (6-acrloyloxyhexyl) 3-chloro-4-hydroxybenzoate, (6-methacryloyloxyhexyl) 3-chloro-4-hydroxybenzoate, (8-acryloyloxyoctyl) 3-chloro-4-hydroxybenzoate, and (8-methacryloyloxyoctyl) 3-chloro-4-hydroxybenzoate.

Also preferred for use herein are styrenesulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethyl orsellinate, β-acryloxyethyl orsellinate, β-methacryloxyethoxyphenol, β-acryloxyethoxyphenol, methacryloxyethyl β-resorcylate, β-acryloxyethyl resorcylate, hydroxystyrenesulfonic acid N-ethylamide, β-methacryloxypropyl p-hydroxybenzoate, β-acryloxypropyl p-hydroxybenzoate, methacryloxymethylphenol, acryloxymethylphenol, methacrylamidopropanesulfonic acid, acrylamidopropanesulfonic acid, β-methacryloxyethoxy-dihydroxybenzene, β-acryloxyethoxy-dihydroxybenzene, γ-styrenesulfonyloxy-β-methacryloxypropanecarboxylic acid, γ-acryloxypropyl-α-hydroxyethyloxysalicylic acid, methacryloxyethyl p-hydroxycinnamate, β-acryloxyethyl p-hydroxycinnamate, 3,5-distyrenesulfonic acid amidophenol methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, β-methacryloxyethyl p-hydroxybenzoate, β-acryloxyethyl p-hydroxybenzoate, β'-methacryloxyethyl β-resorcylate, methacryloxyethyloxycarbonylhydroxybenzoic acid, acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and their metal salts (e.g., zinc salts).

If the color-forming component A is an electron-donating dye precursor and the color-forming component B is an electron-receiving compound, the content of the electron-donating dye precursor in the recording layer preferably falls between 0.05 and 5 g/m², more preferably between 0.1 and 3 g/m².

The amount of the electron-receiving compound to be included in the recording layer preferably falls between 0.5 and 20 parts by weight, more preferably between 3 and 10 parts by weight, relative to 1 part by weight of the electron-donating dye precursor therein. If the amount is less than 0.5 part by weight, high color density in the recording layer can not be ensured. If the amount is greater than 20 parts by weight, the sensitivity of the recording layer will be low and the coatability of the composition to form the layer will be poor.

On the other hand, for diazo compounds for the color-forming component A, preferred are those of the following formula:

wherein Ar represents an aromatic group; and Y⁻ represents an acid anion.

In the formula, the aromatic group for Ar is, for example, a substituted or unsubstituted aryl group. The substituent for the group includes, for example, an alkyl group, an alkoxy group, an alkylthio group, an aryl group, an aryloxy group, an arylthio group, an acyl group, an alkoxycarbonyl group, a carbamoyl group, a carbamido group, a sulfonyl group, a sulfamoyl group, a sulfonamido group, an ureido group, a halogen atom, an amino group, and a heterocyclic group. These substituents may be further substituted.

The aryl group preferably one having from 6 to 30 carbon atoms and examples thereof include phenyl, 2-methylphenyl, 2-chlorophenyl, 2-methoxyphenyl, 2-butoxyphenyl, 2-(2-ethylhexyloxy)phenyl, 2-octyloxyphenyl, 3-(2,4-di-t-pentylphenoxyethoxy)phenyl, 4-chlorophenyl, 2,5-dichlorophenyl, 2,4,6-trimethylphenyl, 3-chlorophenyl, 3-methylphenyl, 3-methoxyphenyl, 3-butoxyphenyl, 3-cyanophenyl, 3-(2-ethylhexyloxy)phenyl, 3,4-dichlorophenyl, 3,5-dichlorophenyl, 3,4-dimethoxyphenyl, 3-(dibutylaminocarbonylmethoxy)phenyl, 4-cyanophenyl, 4-methylphenyl, 4-methoxyphenyl, 4-butoxyphenyl, 4-(2-ethylhexyloxy) phenyl, 4-benzylphenyl, 4-aminosulfonylphenyl, 4-N,N-dibutylaminosulfonylphenyl, 4-ethoxycarbonylphenyl, 4-(2-ethylhexylcarbonyl)phenyl, 4-fluorophenyl, 3-acetylphenyl, 2-acetylaminophenyl, 4-(4-chlorophenylthio) phenyl, 4-(4-methylphenyl)thio-2,5-butoxyphenyl, and 4-(N-benzyl-N-methylamino)-2-dodecyloxycabonylphenyl groups.

These groups may be further substituted with any of an alkyloxy group, an alkylthio group, a substituted phenyl group, a cyano group, a substituted amino group, a halogen atom, and a heterocyclic group.

Diazo compounds favorable to the color-forming component A are described, for example, in JP-A No. 7-276808, paragraphs [0044] to [0049]. The invention, however, is not limited to these examples.

Preferably, the maximum absorption wavelength $\lambda_{max}$ of the diazo compounds for use herein is at most 450 nm, more preferably from 290 nm to 440 nm, in view of the effect of the compound. Also preferably, the diazo compounds have at most 12 carbon atoms, and their solubility in water is at most 1% and in ethyl acetate is at least 5%.

One or more diazo compounds may be used singly or combined as the color-forming component A in accordance with the object of color control.

In a case where at least one of the above-mentioned diazo compounds is used as the color-forming component A, the other color-forming component B to be combined with it is a coupler compound which does not contain a polymerizing group or it may also be a coupler compound containing a polymerizing group.

These two types of coupler compounds couple with a diazo compound in a basic atmosphere and/or a neutral atmosphere to form a color. Depending on the object of color control, two or more such coupler compounds may be combined for use herein.

Examples of the coupler compound having a polymerizing group are active methylene compounds having a methylene group adjacent to the carbonyl group therein, phenol derivatives, naphthol derivatives, azole derivatives, and hetero ring-condensed azole derivatives. These are suitably selected and used herein in accordance with the object of the invention.

The coupler skeleton (coupler) in the coupler compound having a polymerizing group is preferably an active methylene compound having a methylene group adjacent to the carbonyl group therein, a phenol derivative, a naphthol derivative, an azole derivative, or an hetero ring-condensed azole derivative. Specifically, examples thereof include resorcinol, phloroglucine, 2,3-dihydroxynaphthalane, sodium 2,3-dihydroxynaphthalane-6-sulfonate, 1-hydroxy-2-naphthoic acid morpholinopropylamide, sodium 2-hydroxy-3-naphthalenesulfonate, 2-hydroxy-3-naphthalenesulfonic acid anilide, 2-hydroxy-3-naphthalenesulfonic acid morpholinopropylamide, 2-hydroxy-3-naphthalenesulfonic acid 2-ethylhexyloxypropylamide, 2-hydroxy-3-naphthalenesulfonic acid 2-ethylhexylamide, 5-acetamido-1-naphthol, sodium 1-hydroxy-8-acetamidonaphthalene-3,6-disulfonate, 1-hydroxy-8-acetamidonaphthalene-3,6-disulfonic acid dianilide, 1,5-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexanedione, 1,3-cyclopentanedione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl) barbituric acid, N,N'-bis (octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamido-5-pyrazolone, 6-hydroxy-4-methyl-3-cyano-1-(2-ethylhexyl)-2-pyridone, 2,4-bis (benzoylacetamido)toluene, 1,3-bis (pivaloylacetamidomethyl)benzene, benzoylacetonitrile, thenoylacetonitrile, acetoacetanilide, benzoylacetanilide, pivaloylacetanilide, 2-chloro-5-(N-n-butylsulfamoyl)-1-pivaloylacetamidobenzene, 1-(2-ethylhexyloxypropyl)-3-cyano-4-methyl-6-hydroxy-1,2-dihydropyridin-2-one, 1-(dodecyloxypropyl)-3-acetyl-4-methyl-6-hydroxy-1,2-dihydropyridin-2-one, and 1-(4-n-octyloxyphenyl)-3-tert-butyl-5-aminopyrazole.

Details about the coupler compounds are provided in JP-A Nos. 4-201483, 7-223367, 7-223368, 7-323660, 5-278608, 5-297024, 6-18669, 6-18670, 7-316280, 9-216468, 9-216469, 9-319025, 10-035113, 10-193801 and 10-264532.

The coupler compound couples with a diazo compound in a basic atmosphere and/or a neutral atmosphere to form a color. If desired, two or more such coupler compounds may be combined for use herein in accordance with the object of color control.

Examples of couplers having a polymerizing group are shown below. The invention, however, is not limited to these examples.

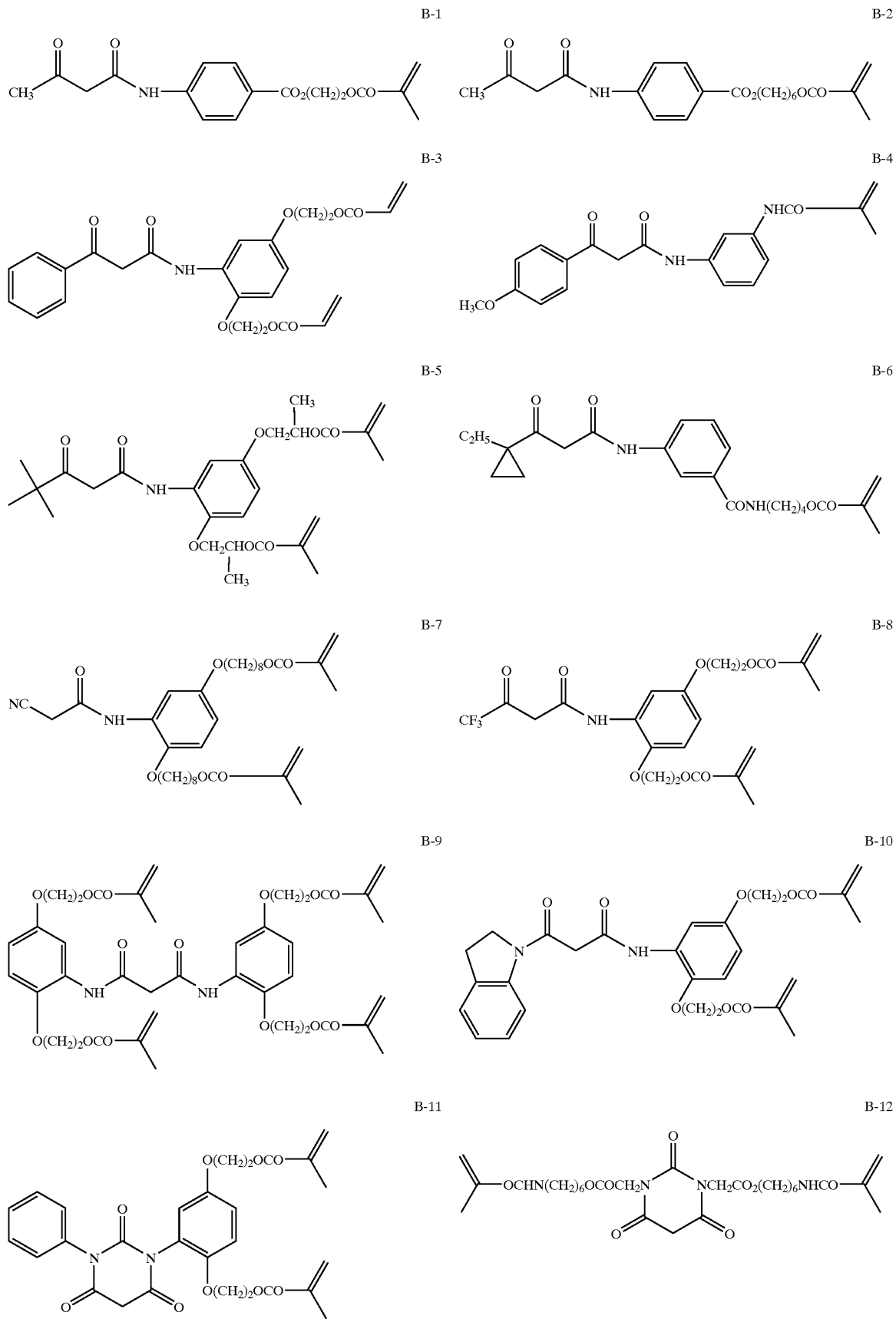

-continued
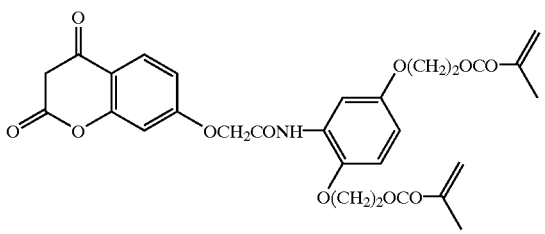
B-13
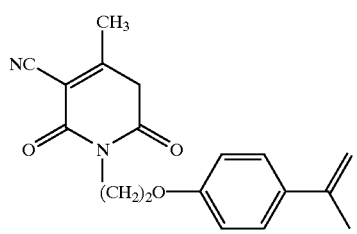
B-14
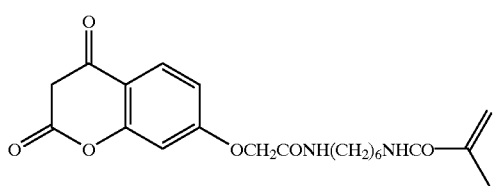
B-15
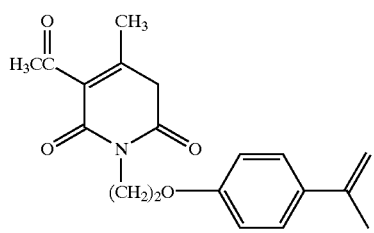
B-16
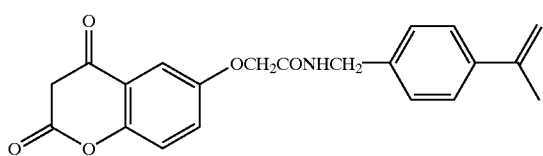
B-17
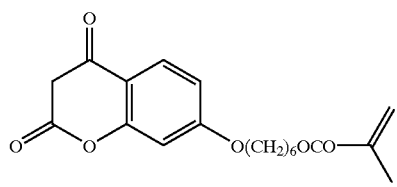
B-18
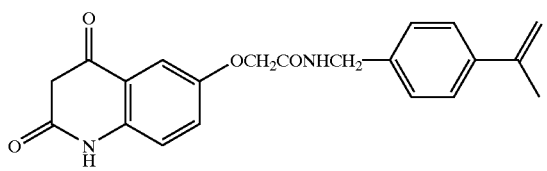
B-19
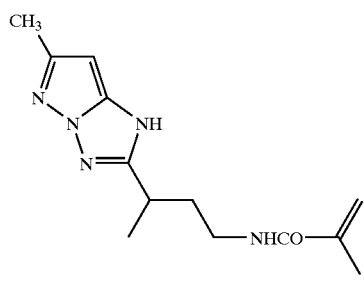
B-20
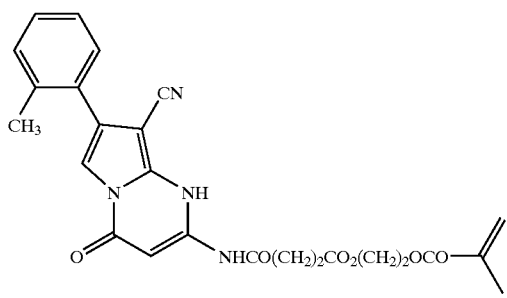
B-21
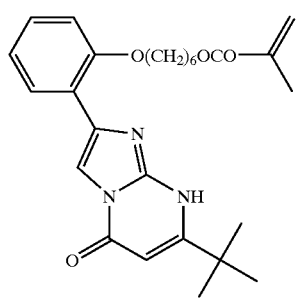
B-22
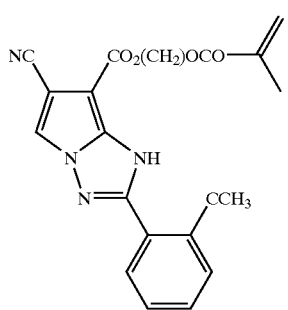
B-23

-continued
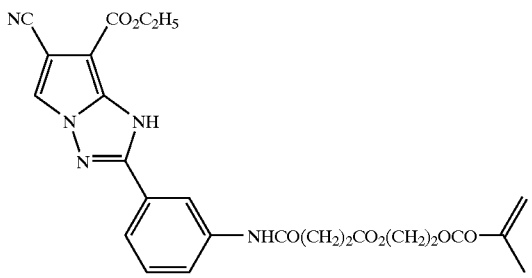
B-24
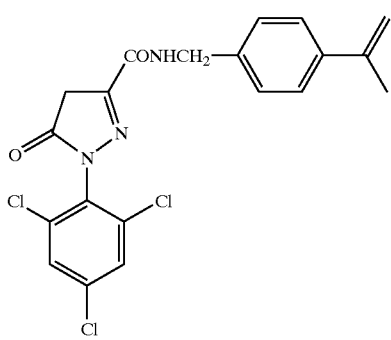
B-25
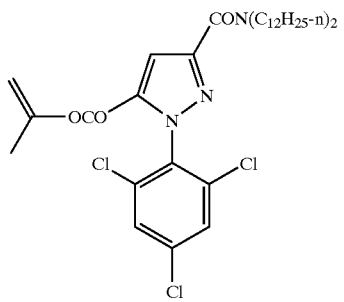
B-26
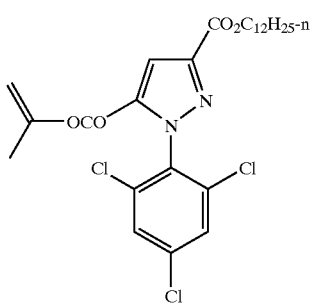
B-27
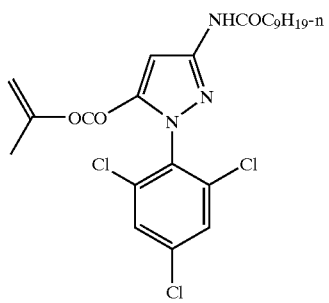
B-28
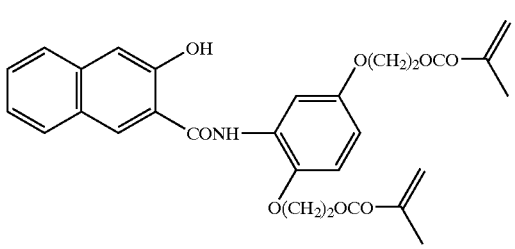
B-29
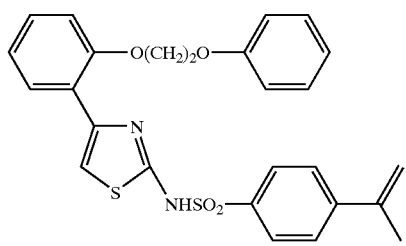
B-30
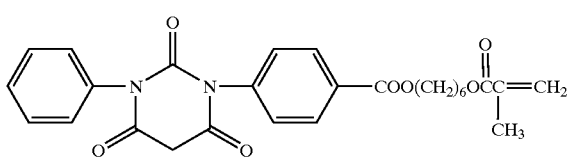
B-31
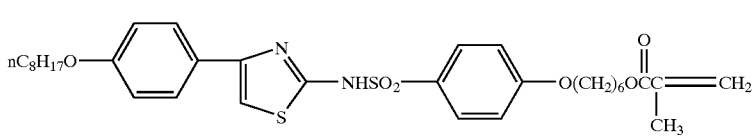
B-32

B-33

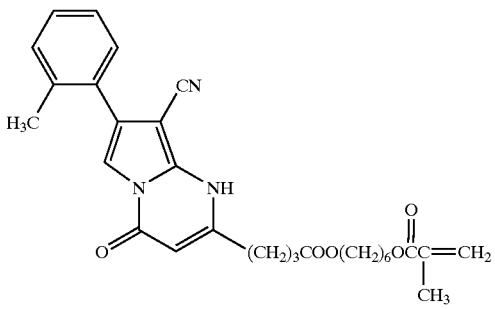

Examples of the coupler compound not having a polymerizing group are those coupler skeleton compounds described hereinabove as the coupler compound having a polymerizing group.

In a case where the color-forming component A is a diazo compound and the color-forming component B is a coupler, the content of the diazo compound in the recording layer is preferably between 0.02 and 5.0 g/m², more preferably between 0.05 and 3.0 g/m².

If the content of the diazo compound is less than 0.02 g/m², the recording material will not have a satisfactory degree of color density; but if it is greater than 5.0 g/m², the coatability of the coating liquid for the recording layer will be poor.

The amount of the coupler compound to be used in the recording layer preferably falls between 0.5 and 20 parts by weight, more preferably between 1 and 10 parts by weight, relative to 1 part by weight of the diazo compound therein. If it is less than 0.5 parts by weight, the recording material will not have a satisfactory degree of color density; but if it is greater than 20 parts by weight, the coatability of the coating liquid for the recording layer will be poor.

The coupler compound used as the color-forming component B, along with the other components and a water-soluble polymer added thereto, may be dispersed in a solid in a sand mill or the like. The couple compound may also be emulsified along with a suitable emulsifier to form an emulsion. The method of dispersing it in solid or emulsifying it into an emulsion is not specifically defined, and thus any known methods may be used. The details of the methods are described in JP-A Nos. 59-190886, 2-141279 and 7-17145.

For promoting the coupling reaction of the diazo compound and the coupler, preferably used are organic bases such as tertiary amines, piperidines, piperazines, amidines, formamidines, pyridines, guanidines and morpholines.

Specifically, examples of the organic bases include piperazines such as N,N'-bis(3-phenoxy-2-hydroxypropyl) piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis[3-phenylthio-2-hydroxypropyl]piperazine, N,N'-bis[3-(β-naphthoxy)-2-hydroxypropyl]piperazine, N-3-(β-naphthoxy)-2-hydroxypropyl-N'-methylpiperazine, 1,4-bis{[3-(N-methylpiperazino)-2-hydroxy]propyloxy}benzene; morpholines such as N-[3-(β-naphthoxy)-2-hydroxy] propylmorpholine, 1,4-bis[(3-morpholino-2-hydroxy) propyloxy]benzene, 1,3-bis[(3-morpholino-2-hydroxy) propyloxy]benzene; piperidines such as N-(3-phenoxy-2-hydroxypropyl)piperidine, N-dodecylpiperidine; and triphenylguanidine, tricyclohexylguanidine, dicyclohexylphenylguanidine, 2-N-methyl-N-benzylaminoethyl 4-hydroxybenzoate, 2-N,N-di-n-butylaminoethyl 4-hydroxybenzoate, 4-(3-N,N-dibutylaminopropoxy)benzenesulfonamide, 4-(2-N,N-dibutylaminoethoxycarbonyl)phenoxyacetic acid amide.

Either singly or combined, one or more of these organic bases may be used herein.

These are described in JP-A Nos. 57-123086, 60-49991, 60-94381, and Japanese Patent Application Nos. 7-228731, 7-235157, 7-235158.

The organic base for use herein may have a polymerizing group.

When such an organic base having a polymerizing group is used in the first embodiment of the photosensitive thermal recording material of the invention, both the diazo compound and the coupler which is the color-forming component A may be encapsulated in microcapsules, and the organic base having a polymerizing group may serve as the color-forming component B. The combination of the diazo compound and the coupler to be the color-forming component A to be in microcapsules should be so selected such that the diazo compound and the coupler require a base for their coupling reaction to form a color.

In the first embodiment of the material, a diazo compound may be used for the color-forming component A and a combination of a coupler having a polymerizing group and an organic base also having a polymerizing group may be used for the color-forming component B.

The amount of the organic base to be in the recording layer specifically defined, but preferably falls between land 30 mols per mol of the diazo compound in the layer.

For promoting the color-forming reaction, a color-forming reaction promoter may be added to the recording layer. The color-forming reaction promoter includes, for example, phenol derivatives, naphthol derivatives, alkoxy-substituted benzenes, alkoxy-substituted naphthalenes, hydroxy compounds, carboxylic acid amide compounds, and sulfonamide compounds.

Polymerizable compounds usable in the second embodiment of the photosensitive thermal recording material of the invention are described below.

The second embodiment of the material may contain a polymerizable compound in its recording layer. Specifically, it may contain, along with the color-forming component A and the color-forming component A to react with the component A to form a color, a color formation-inhibiting compound which has, in one molecule, both a site to inhibit the reaction of the color-forming component A and the other color-forming component B, and an ethylenic unsaturated bond (this will be hereinafter referred to as "polymerizable, color formation-inhibiting compound").

If the color-forming component A in this embodiment is an electron-donating dye precursor and the color-forming component B is an electron-receiving compound not having a polymerizing group, the polymerizable, color formation-inhibiting compound therein is preferably a photopolymerizable monomer having, in one molecule, both a site to inhibit the reaction of the electron-donating dye precursor and the electron-receiving compound, and at least one vinyl group (this will be hereinafter referred to as "photopolymerizable monomer $D_1$").

Specifically, the photopolymerizable monomer $D_1$ includes acrylic acid and its salts, acrylates, acrylamides, methacrylic acid and its salts, methacrylates, methacrylamides, maleic anhydride, maleates, itaconic acid, itaconates, styrenes, vinyl ethers, vinyl esters, N-vinyl-heterocyclic compounds, allyl ethers, and allyl esters.

Of the above examples, especially preferred for use herein are compounds having two or more vinyl groups in one molecule. Specifically, preferable are acrylates and methacrylates with polyalcohols such as trimethylolpropane or pentaerythritol; acrylates and methacrylates with polyphenols or bisphenols such as resorcinol, pyrogallol or phloroglucinol; acrylate or methacrylate-terminated epoxy resins; and acrylate or methacrylate-terminated polyesters.

Of the above, especially preferred are ethylene glycol diacrylate, ethylene glycol dimethacrylate, trimethylolpropane triacrylate, pentaerythritol tetraacrylate, dipentaerythritol hydroxypentaacrylate, hexanediol 1,6-dimethacrylate, and diethylene glycol dimethacrylate.

The molecular weight of the polymerizable monomer $D_1$ preferably falls between about 100 and about 5000, more preferably about 300 and about 2000.

If the polymerizable, color formation-inhibiting compound to be used is the polymerizable monomer $D_1$, its amount preferably falls between 0.1 and 10 parts by weight, more preferably between 0.5 and 5 parts by weight, relative to 1 part by weight of the electron-donating compound to be combined with the coupler compound not having a polymerizing group. If the amount is less than 0.1 part by weight, it is often impossible for a latent image to be formed in the step of exposing the material; but if the amount is greater than 10 parts by weight, the color density of the processed material will be low.

If the color-forming component A is a diazo compound and the color-forming component B is a coupler compound not having a polymerizing group, the polymerizable, color formation-inhibiting compound to be combined with them is preferably a photopolymerizable monomer having, in one molecule, both an acidic group that inhibits the coupling reaction of the diazo compound and the coupler compound, and at least one vinyl group (this will be hereinafter referred to as "photopolymerizable monomer $D_2$").

Examples of the photopolymerizable monomer $D_2$ preferably include styrenesulfonylaminosalicylic acid, vinylbenzyloxyphthalic acid, zinc β-methacryloxyethoxysalicylate, zinc α-acryloxyethoxysalicylate, vinyloxyethyloxybenzoic acid, β-methacryloxyethyl orsellinate, β-acryloxyethyl orsellinate, β-methacryloxyethoxyphenol, β-acryloxyethoxyphenol, methacryloxyethyl β-resorcylate, β-acryloxyethyl β-resorcylate, hydroxystyrenesulfonic acid N-ethylamide, β-methacryloxypropyl p-hydroxybenzoate, β-acryloxypropyl p-hydroxybenzoate, methacryloxymethylphenol, acryloxymethylphenol, methacrylamidopropanesulfonic acid, acrylamidopropanesulfonic acid, β-methacryloxyethoxy-dihydroxybenzene, β-acryloxyethoxy-dihydroxybenzene, γ-styrenesulfonyloxy-β-methacryloxypropanecarboxylic acid, γ-acryloxypropyl-α-hydroxyethyloxysalicylic acid, β-methacryloxyethyl p-hydroxycinnamate, β-acryloxyethyl p-hydroxycinnamate, 3,5-distyrenesulfonic acid amidophenol methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl p-hydroxybenzoate, β-acryloxyethyl p-hydroxybenzoate, β'-methacryloxyethyl β-resorcylate, β-methacryloxyethyloxycarbonylhydroxybenzoic acid, β-acryloxyethyloxycarbonylhydroxybenzoic acid, N,N-di-β-methacryloxyethylaminosalicylic acid, N,N-di-β-acryloxyethylaminosalicylic acid, N,N-di-β-methacryloxyethylaminosulfonylsalicylic acid, and N,N-di-β-acryloxyethylaminosulfonylsalicylic acid.

If the polymerizable, color formation-inhibiting compound to be used is the polymerizable monomer $D_2$, its amount preferably falls between 0.1 and 10 parts by weight, and more preferably between 0.5 and 5 parts by weight, relative to 1 part by weight of the coupler compound not having a polymerizing group to be combined with it. If the amount is less than 0.1 part by weight, it is often impossible for a latent image to be formed in the step of exposing the material; but if greater than 10 parts by weight, the color density of the processed material will be low.

Microcapsules:

In the photosensitive thermal recording material of the invention, the color-forming component (e.g., the electron-donating leuco-dye or the diazonium salt compound) is encapsulated in microcapsules. The encapsulation may be carried out using any known method.

For example, employable is any of a method of coacervation of a hydrophilic wall-forming material as in U.S. Pat. Nos. 2,800,457 and 2,800,458; a method of interfacial polymerization as in U.S. Pat. No. 3,287,154, BP 990,443, JP-B Nos. 38-19574, 42-446, 42–771; a method of polymer precipitation as in U.S. Pat. Nos. 3,418,250 and 3,660,304; a method of using a wall-forming material of isocyanate polyol as in U.S. Pat. No. 3,796,669; a method of using a wall-forming material of isocyanate as in U.S. Pat. No. 3,914,511; a method of using a wall-forming material of urea-formaldehyde or urea-formaldehyde-resorcinol as in U.S. Pat. Nos. 4,001,140, 4,087,376, 4,089,802; a method of using a wall-forming material of melamine-formaldehyde resin or hydroxypropyl cellulose as in U.S. Pat. No. 4,025,455; a method of in-situ monomer polymerization as in JP-B No. 36-9168 and JP-A No. 51-9079; a method of electrolytic dispersion with cooling as in BP 952,807 and 965,074; and a method of spray-drying as in U.S. Pat. No. 3,111,407 and BP 930,422.

Though not limited thereto, one preferred example of encapsulation in microcapsules for producing the photosensitive thermal recording material of the invention is interfacial polymerization, which is carried out as follows: A color-forming component is dissolved or dispersed in a hydrophobic organic solvent to prepare an oil phase that is to be the core of each microcapsule; the oil phase is mixed with an aqueous phase of a solution of a water-soluble polymer; the resulting mixture is emulsified and dispersed in a homogenizer or the like; and then this is heated to cause polymer formation of the interface of the oil drops, thereby forming a polymer microcapsule wall around each oil drop.

Using this method, microcapsules having a uniform size can be formed within a short period of time, and the storability of the material for photosensitive thermal recording material containing them is good.

The polymer reactant to form microcapsule walls is added to oil drops inside and/or outside them. Specific examples of the polymer are polyurethanes, polyureas, polyamides, polyesters, polycarbonates, urea-formaldehyde resins, melamine resins, polystyrenes, styrene-methacrylate copolymers, and styrene-acrylate copolymers. Of those, preferred are polyurethanes, polyureas, polyamides, polyesters, and polycarbonates; and more preferred are polyurethanes and polyureas. Two or more such polymer substances may be combined and used.

Examples of the water-soluble polymer include gelatin, polyvinyl pyrrolidone, and polyvinyl alcohol.

The microcapsule walls of polyurethane may, for example, be formed as follows: A polyisocyanate and a second substance that reacts with it to form microcapsule walls (for example, polyol, polyamine) is mixed in an aqueous, water-soluble polymer solution (aqueous phase) or in an oily medium to be encapsulated (oil phase), and these are emulsified and dispersed, and then heated to cause polymer formation of the interface of the oil drops to thereby form microcapsule walls.

The polyisocyanate and its reactants, polyol and polyamine may be those described in, for example, U.S. Pat. Nos. 3,281,383, 3,773,695, 3,793,268; JP-B Nos. 48-40347, 49-24159; and JP-A Nos. 48-80191/1973, and 48-84086.

The color-forming component (e.g., the electron-donating leuco-dye or diazonium salt compound) encapsulated in the microcapsules may be in the form of a solution or solid.

If the color-forming component is in the form of a solution in microcapsules, for example, the electron-donating leuco-dye or the diazonium salt compound of the component may be encapsulated while it is dissolved in an organic solvent. In this case, the amount of the organic solvent to be used preferably falls between 1 and 500 parts by weight relative to 100 parts by weight of the color-forming component.

In general, the organic solvent may be a high-boiling-point organic solvent, including, for example, phosphates, phthalates, acrylates, methacrylates, other carboxylates, fatty acid amides, alkylated biphenyls, alkylated terphenyls, chloroparaffins, alkylated naphthalenes, diallylethane, compounds that are solid at room temperature, oligomer oils, and polymer oils. Specifically, such organic solvents are described, for example, in JP-A Nos. 59-178451 to 59-178455, 59-178457, 60-242094, 63-85633, 6-194825, 7-13310, 7-13311, 9-106039, and Japanese Patent Application No. 62-75409.

An oilless encapsulation may be employed for forming the microcapsules without using the organic solvent.

In a case where the solubility in the solvent for the electron-donating leuco-dye or the diazonium salt compound to be encapsulated is low, a low-boiling-point solvent in which the solubility of the substance to be encapsulated is high may be used as a co-solvent. Examples of the low-boiling-point solvent include ethyl acetate, propyl acetate, isopropyl acetate, butyl acetate, and methylene chloride.

On the other hand, for the aqueous phase, an aqueous solution of a water-soluble polymer serving as a protective colloid is used. To this is added the oil phase, and the resulting mixture is emulsified and dispersed in a homogenizer or the like. In the process, the water-soluble polymer acts as a dispersant that facilitates uniform dispersion and stabilizes the resulting aqueous emulsion. For ensuring more uniform emulsification and dispersion and for further stabilizing of the resulting emulsion, a surfactant may be added to at least one of the oil phase and the aqueous phase. The surfactant maybe any known surfactant for emulsification. The amount of the surfactant, when added, preferably falls between 0.1 and 5% by weight, more preferably between 0.5 and 2% by weight of the oil phase.

The surfactant to be added to the aqueous phase may be selected from anionic or nonionic surfactants. For this, preferred are those not reacting with the protective colloid to cause precipitation or coagulation.

Preferred examples of the surfactant are sodium alkylbenzenesulfonates, sodium alkylsulfates, sodium dioctyl sulfosuccinate, and polyalkylene glycols (e.g., polyoxyethylene nonylphenyl ether).

As mentioned hereinabove, a water-soluble polymer serving as a protective colloid is in the aqueous phase to be mixed with an oil phase. It may be suitably selected from known anionic polymers, nonionic polymers and ampholytic polymers.

The anionic polymers may be natural substances or synthetic products, containing, for example, —COO— or —$SO_2$—.

Specifically, anionic substances may be natural substances such as arabic gum, alginic acid and pectin; semi-synthetic products such as carboxymethyl cellulose, gelatin derivatives (e.g., phthalated gelatin), sulfated starch, sulfated cellulose and lignin sulfonate; and synthetic products such as copolymers with maleic anhydride (including its hydrolyzate), acrylic (methacrylic) polymers and copolymers, vinylbenzenesulfonic polymers and copolymers, and carboxy-modified polyvinyl alcohol.

Examples of the nonionic polymers include polyvinyl alcohol, hydroxyethyl cellulose, and methyl cellulose.

One example of the ampholytic polymers is gelatin. Of those, preferred are gelatin, gelatin derivatives and polyvinyl alcohol.

The water-soluble polymer may be used in the form of an aqueous, 0 01 to 10 wt. % solution.

The color-forming component and all other components to be encapsulated may be dispersed along with a water-soluble polymer and other color-forming reaction promoters, for example, in a sand mill to form a solid dispersion. More preferably, however, they are dissolved in advance in a high-boiling-point organic solvent which is hardly soluble or insoluble in water to form an oil phase, and the resulting oil phase is mixed with an aqueous polymer solution (aqueous phase) that contains a surfactant and/or a water-soluble polymer serving as a protective colloid, and then emulsified in a homogenizer or the like to form an emulsified dispersion. In this case, a low-boiling-point solvent serving as a dissolution promoter may be used, if desired.

Further, the color-forming component and all other components may be separately emulsified and dispersed; or they may be all mixed, and then dissolved in a high-boiling-point solvent, and thereafter emulsified and dispersed. Preferably, the size of the particles in the emulsified dispersion is at most 1 μm.

The components may be processed in any known manner for emulsification into fine particles. For example, they may be stirred at high speed or ultrasonically dispersed. They can be readily emulsified in any known emulsification device such as homogenizer, Manton Gaulin, ultrasonic disperser, dissolver or Keddy mill.

After having been thus emulsified, the resulting emulsion is kept heated at 30° C. to 70° C. for promoting capsule wall formation. During the reaction, cohesion of microcapsules being formed must be prevented. Thus, water is added to the reaction system to lower the probability of collision of microcapsules with each other; or the system is fully stirred.

An additional dispersant may be added to the reaction system to prevent cohesion of microcapsules. As the polymerization progresses, carbon dioxide is formed. The time at which the formation of carbon dioxide terminates is the end point of the microcapsule wall formation. In general, microcapsules which encapsulate the dye molecules can be formed within a few hours after the start of the reaction.

In the photosensitive thermal recording material of the invention, the mean particle size of the microcapsules is preferably at most 20 μm, and more preferably at most 5 μm for high resolution in image formation. However, if the microcapsules formed are too small, the surface area of a predetermined solid to be encapsulated therein will increase, and a large amount of wall material will be needed. Therefore, it is desirable that the mean particle size of the microcapsules is at least 0.1 μm.

Other Recording Layers:

The other recording layers may be formed by applying, onto the support, coating liquids that are prepared so as to be sensitive to rays longer than 450 nm.

For example, the coating liquids for the other recording layers may be prepared in the same manner as that for the "recording layer sensitive to rays having wavelengths not exceeding 450 nm" in the first and second embodiments mentioned above. To these coating liquids, however, an organic dye is added along with the hexaaryl-biimidazole compound capable of absorbing rays having wavelengths not exceeding 450 nm, to thereby control the desired spectral sensitivity of the layers to be formed. In place of the hexaaryl-biimidazole compound, another organic dye may be used for the other recording layers to thereby control the desired spectral sensitivity of the layers. The other recording layers may have any known layer constitution that differs from the constitution of the recording layer of the first and second embodiments mentioned above.

The organic dye to be in the other recording layers may be suitably selected from those mentioned hereinabove. One or more different types of organic dyes may be used singly or combined in one layer.

Other Components:

In addition to the components mentioned above, the recording layer may contain various surfactants for purposes including coating assistance, static charge prevention, slidability promotion, emulsification for dispersion, and blocking prevention.

The surfactants include, for example, nonionic surfactants such as saponin, polyethylene oxide, polyethylene oxide derivatives, e.g., polyethylene oxide alkyl ethers; anionic surfactants such as salts of alkylsulfonates, salts of alkylbenzenesulfonates, salts of alkylnaphthalenesulfonates, alkylsulfates, N-acyl-N-alkyltaurines, sulfosuccinates, and sulfoalkylpolyoxyethylene-alkylphenyl ethers; ampholytic surfactants such as alkylbetaines, and alkylsulfobetaines; and cationic surfactants such as aliphatic or aromatic quaternary ammonium salts.

In addition to the additives mentioned hereinabove, the recording layers may further contain any other additives. For example, they may contain any of dyes, UV absorbents, plasticizers, fluorescent brighteners, mat agents, coating aids, hardeners, antistatic agents, slidability improvers, etc.

Specific examples of such additives are described, for example, in Research Disclosure, Vol. 176 (December 1978, Item 17643) and Vol. 187 (November 1979, Item 18716).

If desired, a hardener may be in any of the recording layers mentioned above and also the interlayers and the protective layers to be described hereinunder. Preferably, the protective layers contain a hardener to lower their adhesiveness.

The hardener may be, for example, gelatin hardeners generally used in production of photographic materials. They include, for example, aldehyde compounds such as formaldehyde and glutaraldehyde; reactive halogen compounds described in U.S. Pat. No. 3,635,718; reactive ethylenic unsaturated group-containing compounds described in U.S. Pat. No. 3,365,718; aziridine compounds described in U.S. Pat. No. 3,017,280; epoxy compounds described in U.S. Pat. No. 3,091,537; halogenocarboxyaldehydes such as mucochloric acid, dioxanes such as dihydroxydioxane and dichlorodioxane; vinylsulfones described in U.S. Pat. Nos. 3,642,486 and 3,687,707; vinylsulfone precursors described in U.S. Pat. No. 3,841,872; and ketovinyls described in U.S. Pat. No. 3,640,720. Also usable are inorganic hardeners such as chromium alum, zirconium sulfate, and boric acid.

Above all, preferred are 1,3,5-triacryloyl-hexahydro-s-triazine, 1,2-bisvinylsulfonylmethane, 1,3-bis(vinylsulfonylmethyl)propanol-2, bis(α-vinylsulfonylacetamido) ethane, 2,4-dichloro-6-hydroxy-s-triazine sodium salt, 2,4,6-triethylenimino-s-triazine, and boric acid.

Preferably, the amount of the hardener to be included in the layers falls between 0.5 and 5% by weight of the amount of the binder therein.

It is desirable that the "recording layers which are sensitive to rays having wavelengths not exceeding 450 nm" and the other recording layers each have a thickness falling between 0.1 and 50 μm, more preferably between 3 and 35 μm.

Interlayer:

If desired, an interlayer may be disposed between the adjacent monochromatic recording layers. The interlayer essentially comprises a binder, and optionally contains additives such as hardener, polymer latex, filter dye, mica, UV absorbent, etc.

The binder may be the same as that in the photopolymerizable composition mentioned hereinabove, or may be the same water-soluble polymer as that used in encapsulating the color-forming component in microcapsules. Apart from these, also usable as the binder are acrylic resins such as polystyrene, polyvinyl formal, polyvinyl butyral, polymethyl acrylate, polybutyl acrylate, polymethyl methacrylate, polybutyl methacrylate and their copolymers; as well as other solvent-soluble polymers such as phenolic resins, styrene-butadiene resins, ethyl cellulose, epoxy resins, and urethane resins, and their polymer latexes. Above all, preferred are gelatin and polyvinyl alcohol.

The binder may also be in the protective layers mentioned below and in the recording layers mentioned above.

For preventing diffusion of the active ingredients in the recording layers into the interlayer, it is desirable to add mica or synthetic mica (e.g., MRI's Suzulite 40H) to the interlayer. Adding filter dye to the interlayer is also preferred for forming sharp images. The filter dye to be included in the interlayer may be any known organic dye. Specifically, the filter dye may be selected such that it can absorb the rays to which the recording layer adjacent to the interlayer is sensitive.

The thickness of the interlayer preferably falls between 0.1 and 10 μm, more preferably between 0.5 and 3 μm.

Protective Layer:

If desired, a protective layer may be disposed in the photosensitive thermal recording material of the invention. Preferably, the protective layer is an outermost layer of the material that faces the light source to which the material is exposed.

Examples of the material for the protective layer include water-soluble polymers such as gelatin, polyvinyl alcohol, carboxy-modified polyvinyl alcohol, vinyl acetate-acrylamide copolymer, silicon-modified polyvinyl alcohol, starch, modified starch, methyl cellulose, carboxymethyl cellulose, hydroxymethyl cellulose, gelatins, arabic gum, casein, styrene-maleic acid copolymer hydrolyzate, styrene-maleic acid copolymer half-ester hydrolyzate, isobutylene-maleic anhydride copolymer hydrolyzate, polyacrylamide derivatives, polyvinyl pyrrolidone, sodium polystyrene-sulfonate, and sodium alginate; and latexes such as styrene-butadiene rubber latex, acrylonitrile-butadiene rubber latex, methyl acrylate-butadiene rubber latex, and polyvinyl acetate emulsion.

When the material for the protective layer is crosslinked, its storage stability can be improved. Any known crosslinking agent may be used to carry out the crosslinking. Specifically, usable are water-soluble precondensates such as N-methylolurea, N-methylolmelamine, and urea-formalin; dialdehydes such as glyoxal and glutaraldehyde; inorganic crosslinking agents such as boric acid and borax; and polyamidepichlorohydrin.

The protective layer may contain any known pigment, metal soap, wax, and surfactant. It may further contain any known UV absorbent or UV absorbent precursor.

The amount of the protective layer preferably falls between 0.2 and 5 g/m$^2$, more preferably between 0.5 and 3 g/m$^2$.

Support:

Examples of the support include paper; synthetic paper such as coated paper, and laminate paper; films such as polyethylene terephthalate films, cellulose triacetate films, polyethylene films, polystyrene films, and polycarbonate films; and metal sheets of, for example, aluminium, zinc or copper. The support may be subjected to any of the following processes. It may be surface-treated, or may be coated with an undercoat layer, or may be plated by metal vapor deposition.

Also usable are the supports described in Research Disclosure, Vol. 200 (December 1980, Item 20036, XVII). If desired, the support may contain any of fluorescent brightener, blueing dye, pigment, etc. Flexible sheets of polyurethane foam or rubber may also be used for the support.

If desired, the surface of the support may be coated with an anti-halation layer; and the back surface thereof may be coated with a slip layer, an antistatic layer, a curl preventing layer, and an adhesive layer. Also if desired, an adhesive layer may be provided between the support and the recording layer. In this case, the support serves as a stripping sheet, and the material with an image formed thereon may be adhered to an object via its adhesive layer.

An antihalation layer may be provided between the support and the recording layer. When the support is transparent, an antihalation layer may be provided on the surface which does not have the recording layer. The antihalation layer may be bleached through exposure to light or heat.

The antihalation layer that can be bleached through exposure to light maybe a combination of a hexaaryl-biimidazole compound and/or an organic dye, and an organic boron compound such as those mentioned hereinabove. The antihalation layer that can be bleached through exposure to heat may be a composition capable of generating a base or a nucleating agent under heat to bleach the organic dye existing therein.

A layer formed of a polymer having low permeability to oxygen such as gelatin or polyvinyl alcohol (PVA) may be provided between the support and the recording layer. The polymer layer is effective for preventing color fading caused by photo-oxidation of the images formed.

Production of Photosensitive Thermal Recording Material:

The photosensitive thermal recording material of the invention may be produced by dissolving the necessary components mentioned above for the coating compositions for the recording layers, protective layers and interlayers respectively in a solvent if necessary, and the resulting coating compositions are applied onto a support using any known coating method, and dried thereon. Examples of the solvent include water; alcohols such as methanol, ethanol, n-propanol, isopropanol, n-butanol, sec-butanol, methyl cellosolve, and 1-methoxy-2-propanol; halogen-containing solvents such as methylene chloride and ethylene chloride; ketones such as acetone, cyclohexanone, and methyl ethyl ketone; esters such as methyl cellosolve acetate, ethyl acetate, and methyl acetate; toluene, and xylene. One or more these solvents may be used either singly or as combined. Of those, especially preferred is water.

For applying the coating compositions onto a support, usable is any of blade coaters, rod coaters, knife coaters, roll doctor coaters, reverse roll coaters, transfer roll coaters, gravure coaters, kiss roll coaters, curtain coaters, and extrusion coaters.

Examples of the coating method include those described in Research Disclosure, Vol. 200 (December 1980, Item 20036, XV).

The photosensitive thermal recording material of the invention for multi-color image formation is produced, for example, as follows.

A first recording layer that contains microcapsules with yellow color-forming component therein and a photopolymerizable composition sensitive to rays having a center wavelength of $\lambda_1$ is formed on a support; then a second recording layer that contains microcapsules with a magenta color-forming component therein and a photopolymerizable composition sensitive to rays having a center wavelength of $\lambda_2$ is formed on the first layer; and a third recording layer that contains microcapsules with a cyan color-forming component therein and a photopolymerizable composition sensitive to rays having a center wavelength of $\lambda_3$ is formed on the second layer. In the material of the invention, at least one of the first to third recording layers has the constitution of the above-mentioned first or second embodiment. If desired, a protective layer may be provided as the outermost layer, and an interlayer may be provided between the neighboring recording layers. The center wavelengths $\lambda_1$, $\lambda_2$ and $\lambda_3$ differ from each other.

To form a multi-color image thereon, the photosensitive thermal recording material of the type mentioned above is exposed imagewise to different rays from different light sources in the manner described hereinunder, in which the plural light sources used give rays of different wavelengths in accordance with the absorption wavelengths of the respective recording layers of the material. Thus, each recording layer selectively absorbs the rays from its specific light source, and forms a latent image. Therefore, the photosensitivity of the material is high and the material can form a sharp multi-color image thereon. After being exposed imagewise, the entire surface of the material is exposed to light to thereby degrade and decolor the color-forming components (these are light-absorbing components) such as the hexaaryl-biimidazole compound and the organic dye still remaining in the layers. Accordingly, the material of the invention can form thereon a high-contrast and high-quality color image and its fog density is low.

The photosensitive thermal recording material of the invention has many applications, for example, it may be used for color printers, labels, color proofs, copiers, facsimiles, mother prints, etc.

The process of image formation on the photosensitive thermal recording material of the invention is described hereinunder. As mentioned hereinabove, the image formation process comprises at least a step of exposure to light, a step of color formation and a step of image fixation.

In the exposing step, the photopolymerizable composition and the substantially colorless compound having a site which reacts with a color-forming component to form a color in the recording layers in the material are exposed imagewise according to the desired image pattern, and cured to give a latent image having the pattern.

In this step, the light sources used for image formation are preferably so selected that their rays correspond to the wavelengths to be absorbed by the recording layers of the material. This ensures high sensitivity and formation of a sharp color image on the material. Specifically, for the recording layer of the first or second embodiment of the invention (this is sensitive to rays having wavelengths not exceeding 450 nm), selectively used is a known light source that gives rays having wavelengths not exceeding 450 nm; and for the other recording layers, selectively used are known light sources that give UV to IR rays falling within a wavelength range of from 300 to 1000 nm. For example, preferred are blue, green, violet or red laser sources or LED, as they may be in compact and small-sized devices and are inexpensive.

After exposure to light using the above method, the material is then processed for color formation. In the color-forming step, the recording layers are heated, and the color-forming component therein reacts with the substantially colorless compound (this has a site which reacts with the color-forming component to form a color) also therein to thereby form a color in accordance with the latent image already formed in the material, and, as a result, a visible image is thus formed.

The recording layers may be heated in any known manner, for example, with a heat roller or the like. In general, the recording layers are heated preferably at a temperature falling between 80° C. and 200° C., more preferably between 85° C. and 130° C. If the heating temperature is lower than 80° C., the color density will be low; but if higher than 200° C., the non-image area (background area) will be yellowed and the support will be damaged. The heating time preferably falls between 1 second and 5 minutes, more preferably between 3 seconds and 1 minute.

Before being heated under those conditions, the surface of the material may be uniformly preheated at a predetermined temperature lower than the temperature for color formation. The sensitivity of the material may thus be further increased.

After having been processed for color formation, the material is further processed to fix the color image thereon. In the fixing step, the entire surface of the material is exposed to light from a specific light source, whereby the color image formed in the previous color-forming step is fixed on the material and the color-forming components (hexaaryl-biimidazole compound, organic dye) still remaining in the material are all degraded and decolored.

Through the fixing step, the degree of whiteness of the non-image area is increased, and a chemically-stable final image can be obtained. In case where a diazonium salt compound is used for the color-forming component, the diazonium salt compound remaining in the image-recorded layer can be inactivated through post-exposure to light. Therefore, the step of post-exposure to light is effective also for stabilizing the final image, and the thus-stabilized final image does not undergo density change and discoloration while stored.

Any known light source is usable in the fixing step. For example, preferred are mercury lamps, ultra-high-pressure mercury lamps, non-electrode discharge mercury lamps, xenon lamps, tungsten lamps, metal halide lamps, fluorescent lamps, etc.

The method of exposing the recorded material to light in the fixing step is not specifically defined. For example, the entire surface of the recorded material may be exposed to light all at once; or the surface thereof may be gradually exposed to a scanning light source until finally the entire surface is exposed. However, any method in which the entire surface of the image-recorded material is finally exposed to almost uniform light for fixing the color image on the material is suitable. The method of post-exposure of the entire surface of the image-recorded material is preferred since it more effectively achieves the effect of the invention.

The exposure time in the fixing step is suitably set such that the formed image is sufficiently fixed and the non-image area (background area) is sufficiently decolored within that time. However, in order to ensure sufficient image fixation and sufficient deceleration in the non-image area without lowering the recording speed, the exposure time preferably falls between a few seconds and tens minutes, and more preferably between a few seconds and a few minutes.

The photosensitive thermal recording material of the invention, in which at least one recording layer comprises a combination of a hexaaryl-biimidazole compound and an organoboron compound, has high sensitivity to rays having wavelengths not exceeding 450 nm, and detailed, high-contrast images can be formed on the material with little fog (yellowing) in the non-image area. When an organic dye capable of absorbing rays falling within a wavelength range of UV and visible to IR rays is added to the material, the sensitivity of the material to a desired light source is increased more and any desired color images of high quality can be formed thereon. The invention is applicable to multi-color image formation to produce sharp, full-color images, without lowering the color purity of the images formed.

EXAMPLES

The invention is described in more detail with reference to the following Examples, which, however, are not intended to restrict the scope of the invention In the Examples, "part" and "%" are all by weight.

Preparation of Electron-Donating Leuco-Dye Microcapsule Suspension:

4.4 parts of a yellow-forming, electron-donating leuco dye (1) shown below was dissolved in 18.4 parts of ethyl acetate, to which were added 21 parts of a capsule wall-forming material (Takenate D-110® manufactured by Takeda Chemical Industry) and 0.7 parts of a capsule wall-forming material (Millionate MR200® manufactured by Nippon Polyurethane Industry).

The resulting solution was added to a liquid mixture of 52 parts of 8% phthalated gelatin and 0.3 part of 10% sodium dodecylbenzenesulfonate, and emulsified and dispersed at 20° C. to prepare an emulsion. 54 parts of aqueous 1.1% tetraethylenepentamine were added to the resulting emulsuion, and this was heated at 60° C. while being stirred. After 2 hours, a suspension of microcapsules having a mean particle size of 0.5 μm was obtained, in which the electron-donating leuco-dye (1) formed a core of each microcapsule. Water was added thereto so as to control the suspension to have a solid content of 25%.

Electron-Donating Leuco-Dye (1):

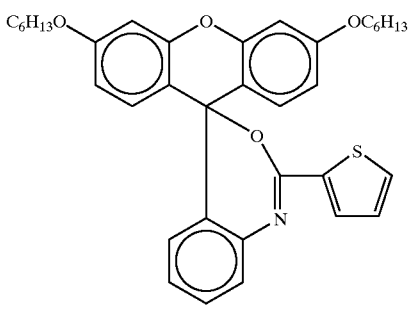

Preparation of Photopolymerizable Composition Emulsions:
Preparation of Photopolymerizable Composition Emulsion (1):

100 parts of a mixture of electron-receiving compounds (1) and (2) both having a polymerizing group shown below (50/50), and 0.1 part of a thermal polymerization inhibitor (ALI) also shown below were dissolved in 125.0 parts of isopropyl acetate (having a solubility in water of about 4.3%) at 42° C. to prepare a mixed solution I. To the mixed solution I, added were 18.0 parts of a hexaaryl-biimidazole (1) shown below [2,2'-bis (2-chlorophenyl)-4,4',5,5'-tetraphenyl-1,2'-biimidazole] and 6.0 parts of an organoboron compound, Compound (b-10) shown above, and dissolved therein at 42° C. to prepare a mixed solution II.

The mixed solution II was added to a mixture of 300.1 parts of aqueous 8% gelatin and 17.4 parts of aqueous 10% surfactant (1) shown below, and emulsified while being stirred in a homogenizer (from Nippon Seiki) at 10000 rpm for 5 minutes to prepare a photopolymerizable composition emulsion (1). This was heated at 40° C. for 3 hours to remove the solvent, and then controlled to have a solid content of 30%.

Hexaaryl-biimidazole (1):

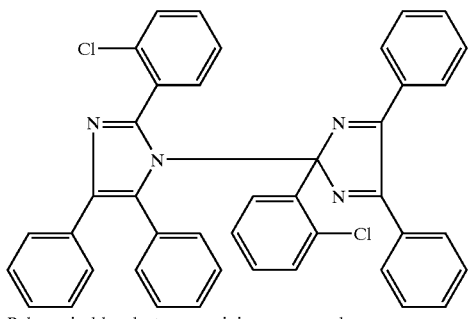

Polymerizable, electron-receiving compound:

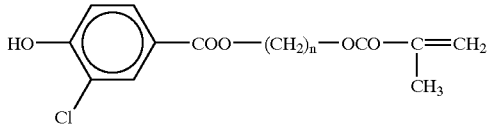

n = 5 (1)
n = 6 (2)

ALI:

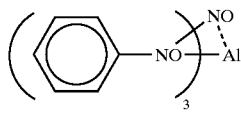

-continued
Surfactant (1):

Preparation of Photopolymerizable Composition Emulsion (2):

A photopolymerizable composition emulsion (2) was prepared in the same manner as that for the photopolymerizable composition emulsion (1), except that 0.5 part of a nonionic organic dye, compound (3-15) shown above was added to the mixed solution I.

Preparation of Photopolymerizable Composition Emulsion (3):

A photopolymerizable composition emulsion (3) was prepared in the same manner as that for the photopolymerizable composition emulsion (1), except that 1.0 part of a nonionic organic dye 1, Compound (3-15) shown above was added to the mixed solution I.

Preparation of Photopolymerizable Composition Emulsion (4):

A photopolymerizable composition emulsion (4) was prepared in the same manner as that for the photopolymerizable composition emulsion (1), except that 0.5 part of a nonionic organic dye 2, Compound (3-16) shown above was added to the mixed solution I.

Preparation of Photopolymerizable Composition Emulsion (5):

A photopolymerizable composition emulsion (5) was prepared in the same manner as that for the photopolymerizable composition emulsion (1), except that 0.5 part of a nonionic organic dye 3, Compound (3-17) shown above was added to the mixed solution I.

Preparation of Photopolymerizable Composition Emulsion (6):

A photopolymerizable composition emulsion (6) was prepared in the same manner as that for the photopolymerizable composition emulsion (1), except that 0.5 part of a cationic organic dye 4, Compound (1-16) shown above was added to the mixed solution I.

Preparation of Photopolymerizable Composition Emulsion (7):

A photopolymerizable composition emulsion (7) was prepared in the same manner as that for the photopolymerizable composition emulsion (1), except that the organoboron compound was not used.

Preparation of Photopolymerizable Composition Emulsion (8):

A photopolymerizable composition emulsion (8) was prepared in the same manner as that for the photopolymerizable composition emulsion (2), except that the hexaaryl-biimidazole compound (1) was not used.

Preparation of Coating Liquids for Recording Layer:
Preparation of Coating Liquid (I) for Recording Layer:

6.2 parts of the electron-donating leuco-dye microcapsule suspension, 9.5 parts of the photopolymerizable composition emulsion (1) and 1.8 parts of aqueous 15% gelatin were mixed, and 6.3 parts of water were added to prepare a coating liquid (I) for recording layer.

Preparation of Coating Liquids (II) to (VIII) for Recording Layer:

Coating liquids (II) to (VIII) for recording layer were prepared in the same manner as that for the coating liquid (I), except that each of the photopolymerization composition emulsions (2) to (8), respectively, was used in place of the emulsion (1).

Preparation of Coating Liquid for Protective Layer:

8.8 parts of aqueous 18% gelatin, 7.0 parts of distilled water 0.4 part of aqueous 2% surfactant (2) shown below, 1.2 parts of aqueous 2% surfactant (3) shown below, 8.8 parts of aqueous 2% vinylsulfone compound (hardener), and 1.8 parts of 20% polyacrylic acid (Julymer AC10LA® manufactured by Nippon Junyaku) were mixed to prepare a coating liquid for protective layer.

Surfactant (2):

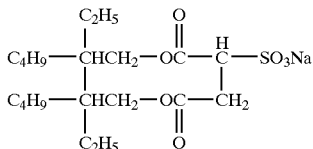

Surfactant (3):

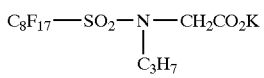

Surfactant (4):

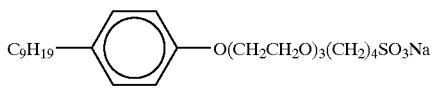

Example 1

Using a coating bar, the coating liquid (I) was applied onto a 198 μm-thick WP support and dried to form thereon a recording layer having a dry weight of 4.8 g/m².

Also using a coating bar, the coating liquid (I) was applied onto the coated support and dried to form thereon a protective layer having a dry weight of 2 g/m². Thus was produced a photosensitive thermal recording material (1) of the invention.

Examples 2 to 6

Photosensitive thermal recording materials (2) to (6) of the invention having a recording layer and a protective layer laminated in that order on a support were produced in the same manner as in Example 1, except that each of the coating liquids (II) to (VI) respectively was used in place of the coating liquid (I) to form the recording layer.

Comparative Examples 1 to 2

Photosensitive thermal recording materials (7) and (8) of comparative examples having a recording layer and a protective layer laminated on a support in that order were produced in the same manner as in Example 1, except that the coating liquid (VII) and (VIII), respectively, was used in place of the coating liquid (I) to form the recording layer.

The photosensitive thermal recording materials (1) to (8) were processed in the same manner for image formation thereon. Specifically, the method of processing the material (1) is described below.

With its protective layer facing a light source of 450 nm semiconductor laser having a wavelength of 450 nm, the material (1) was exposed imagewise to light through an optical step wedge through which the light energy was varied in a predetermined order and was at most 12 mJ/cm² (exposing step). Next, the material (1) having a latent image formed thereon was heated on a hot plate at 110° C. for 10 seconds (color-forming step), and then wholly exposed to a 38000 lux fluorescent lamp for 30 seconds (fixing step).

As a result, the recording layer in the photosensitive thermal recording materials (1) to (6) formed a vivid yellow color, and the materials (1) to (6) all had a sharp, step-wedge shaped yellow image formed thereon. In these, the background area was white with little fogging.

Sensitivity Evaluation:

The energy needed for forming the background area in each material (that is, the energy needed for differentiating the background area from the image area therein) was determined, and this indicates the sensitivity of each material.

The materials that needed a lower value of energy have a higher sensitivity. The data are shown in Table 1 below.

Measurement of Fog Density:

After being fixed, the fog density [OD (Y)] in the background area (non-image area) of each material was measured with a Macbeth transmission densitometer (a blue filter manufactured by Macbeth). The data are shown in Table 1 below.

TABLE 1

| | Coating Liquid for Recording Layer | Hexaaryl-biimidazole 1 | Organoboron Compound | Organic Dye | Sensitivity (mJ/cm²) | Background Fogging OD (Y) |
|---|---|---|---|---|---|---|
| Example 1 | (I) | yes | yes | — | 0.8 | 0.03 |
| Example 2 | (II) | yes | yes | 1 (0.5 part) | 0.3 | 0.05 |
| Example 3 | (III) | yes | yes | 1 (1.0 part) | 0.2 | 0.05 |
| Example 4 | (IV) | yes | yes | 2 | 0.3 | 0.05 |
| Example 5 | (V) | yes | yes | 3 | 0.3 | 0.05 |
| Example 6 | (VI) | yes | yes | 4 | 0.5 | 0.05 |
| Co. Example 1 | (VII) | yes | no | — | 50.0 | 0.03 |
| Co. Example 2 | (VIII) | no | yes | 1 (0.5 part) | 1.3 | 0.09 |

From the data in Table 1 above, it is clear that the photosensitive thermal recording materials (1) to (6) of the invention containing both a hexaaryl-biimidazole compound and an organoboron compound all have high sensitivity and the non-image area (background area) around the image formed there on is white with little fogging. In particular, the materials (2) to (6) which contain any of organic dyes 1 to 3 have higher sensitivity. On the other hand, the photosensitive thermal recording material (7) of Comparative Example 1 which contains a hexaaryl-biimidazole compound but does not contain an organoboron compound is not good, as its sensitivity is low though the fog density is not so high. The photosensitive thermal recording material (8) of Comparative Example 2 which does not contain a hexaaryl-biimidazole compound is also not good, as the fog density is high and the sensitivity is low.

As was described in detail with reference to the preferred embodiments, the present invention provides a photopolymerizable composition which is highly sensitive to UV rays and visible to IR rays within a wavelength range that includes wavelengths not longer than 450 nm, which is effective for decoloring a dye component that absorbs the rays falling within the wavelength range, and which therefore does not yellow after exposure to light. Further, the invention provides a photosensitive thermal recording material which is processable in a complete dry system which does not require liquid developer and does not generate waste, which enables high-sensitivity image recording thereon by exposure to light falling within a range of UV rays and visible to IR rays, and particularly to rays having wavelengths not exceeding 450 nm, and in which the non-image area (background area) is almost completely decolored and thus high-contrast, black-and-white or color images that fog little in the background area are formed.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising at least one ethylenic unsaturated bond-containing compound, a hexaaryl-biimidazole compound, and an organoboron compound of the following general formula (1):

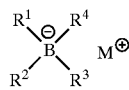
(1)

wherein $R^1$, $R^2$, $R^3$ and $R^4$ each independently represents an aliphatic group, an aromatic group, a heterocyclic group, or a group represented by the following general formula (2); and $M^+$ represents a group capable of forming a cation;

(2)

wherein $R^5$, $R^6$ and $R^7$ each independently represents an aliphatic group or an aromatic group.

2. The photopolymerizable composition of claim 1, wherein at least one of the substituents $R^1$, $R^2$, $R^3$ and $R^4$ in general formula (1) represents a group represented by general formula (2).

3. The photopolymerizable composition of claim 1, wherein a content of the organoboron compound in the photopolymerizable composition is between 0.1 and 10% by weight of the content of the ethylenic unsaturated bond-containing compound.

4. The photopolymerizable composition of claim 1, which contains at least one of cationic organic dyes, anionic organic dyes and nonionic organic dyes.

5. The photopolymerizable composition of claim 4, wherein at least one of the substituents $R^1$, $R^2$, $R^3$ and $R^4$ in general formula (1) represents a group represented by general formula (2).

6. The photopolymerizable composition of claim 4, wherein a content of the organoboron compound in the photopolymerizable composition is between 0.1 and 10% by weight of the content of the ethylenic unsaturated bond-containing compound.

7. A photosensitive thermal recording material having recording layers on a support, in which at least one recording layer contains the following:
   (a) a color-forming component A encapsulated in thermo-responsive microcapsules,
   (b) a substantially colorless compound B which has a site which reacts with the color-forming component A to form a color and which exists outside the thermo-responsive microcapsules, and
   (c) a photopolymerizable composition;
and in which the photopolymerizable composition (c) comprises the following:
   (i) at least one, ethylenic unsaturated bond-containing compound,
   (ii) a hexaaryl-biimidazole compound, and
   (iii) an organoboron compound of the following general formula (1):

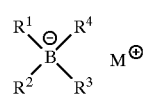
(1)

wherein $R^1$, $R^2$, $R^3$ and $R^4$ each independently represents an aliphatic group, an aromatic group, a heterocyclic group, or a group of the following general formula (2); and $M^+$ represents a group capable of forming a cation;

(2)

wherein $R^5$, $R^6$ and $R^7$ each independently represents an aliphatic group or an aromatic group.

8. The photosensitive thermal recording material of claim 7, wherein the photopolymerizable composition contains at least one of cationic organic dyes, anionic organic dyes and nonionic organic dyes.

9. The photosensitive thermal recording material of claim 8, wherein at least one, ethylenic unsaturated bond-containing compound is the compound B.

10. The photosensitive thermal recording material of claim 9, wherein the recording layers are formed to have a multi-layered structure that comprises a first recording layer which is sensitive to light having a center wavelength of $\lambda_1$ and forms one color, a second recording layer which is sensitive to light having a center wavelength of $\lambda_2$ and forms a color that differs from the color formed by the first recording layer, ... an i'th recording layer which is sensitive to light having a center wavelength of $\lambda_i$ and forms a color that differs from the colors formed by the first, second, ... (i−1)th recording layers, laminated in that order on the support.

11. The photosensitive thermal recording material of claim 8, wherein the ethylenic unsaturated bond-containing compound is a color formation-inhibiting compound having, in one molecule, a site which inhibits the reaction of the color-forming component A and the compound B.

12. The photosensitive thermal recording material of claim 11, wherein the recording layers are formed to have a multi-layered structure that comprises a first recording layer which is sensitive to light having a center wavelength of $\lambda_1$ and forms one color, a second recording layer which is sensitive to light having a center wavelength of $\lambda_2$ and forms a color that differs from the color formed by the first recording layer, . . . an i'th recording layer which is sensitive to light having a center wavelength of $\lambda_i$ and forms a color that differs from the colors formed by the first, second, . . . (i−1)th recording layers, laminated in that order on the support.

13. The photosensitive thermal recording material of claim 8, wherein the recording layers are formed to have a multi-layered structure that comprises a first recording layer which is sensitive to light having a center wavelength of $\lambda_1$ and forms one color, a second recording layer which is sensitive to light having a center wavelength of $\lambda_2$ and forms a color that differs from the color formed by the first recording layer, . . . an i'th recording layer which is sensitive to light having a center wavelength of $\lambda_i$ and forms a color that differs from the colors formed by the first, second, . . . (i−1)th recording layers, laminated in that order on the support.

14. The photosensitive thermal recording material of claim 7, wherein at least one, ethylenic unsaturated bond-containing compound is the compound B.

15. The photosensitive thermal recording material of claim 14, wherein the recording layers are formed to have a multi-layered structure that comprises a first recording layer which is sensitive to light having a center wavelength of $\lambda_1$ and forms one color, a second recording layer which is sensitive to light having a center wavelength of $\lambda_2$ and forms a color that differs from the color formed by the first recording layer, . . . an i'th recording layer which is sensitive to light having a center wavelength of $\lambda_i$ and forms a color that differs from the colors formed by the first, second, . . . (i−1)th recording layers, laminated in that order on the support.

16. The photosensitive thermal recording material of claim 7, wherein the ethylenic unsaturated bond-containing compound is a color formation-inhibiting compound having, in one molecule, a site which inhibits the reaction of the color-forming component A and the compound B.

17. The photosensitive thermal recording material of claim 16, wherein the recording layers are formed to have a multi-layered structure that comprises a first recording layer which is sensitive to light having a center wavelength of $\lambda_1$ and forms a color, a second recording layer which is sensitive to light having a center wavelength of $\lambda_2$ and forms a color that differs from the color formed by the first recording layer, . . . an i'th recording layer which is sensitive to light having a center wavelength of $\lambda_i$ and forms a color that differs from the colors formed by the first, second, . . . (i−1)th recording layers, laminated in that order on the support.

18. The photosensitive thermal recording material of claim 7, wherein the recording layers are formed to have a multi-layered structure that comprises a first recording layer which is sensitive to light having a center wavelength of $\lambda_1$ and forms one color, a second recording layer which is sensitive to light having a center wavelength of $\lambda_2$ and forms a color that differs from the color formed by the first recording layer, . . . an i'th recording layer sensitive to light having a center wavelength of $\lambda_i$ and forms a color that differs from the colors formed by the first, second, . . . (i−1)th recording layers, laminated in that order on the support.

\* \* \* \* \*